US010327365B2

(12) United States Patent
Jang et al.

(10) Patent No.: US 10,327,365 B2
(45) Date of Patent: Jun. 18, 2019

(54) MAGNETIC FIELD SHIELDING UNIT AND MULTI-FUNCTIONAL COMPLEX MODULE INCLUDING SAME

(71) Applicant: Amosense Co., Ltd., Cheonan-si (KR)

(72) Inventors: Kil Jae Jang, Seongnam-si (KR); Dong Hoon Lee, Yongin-si (KR)

(73) Assignee: Amosense Co., Ltd., Cheonan-si (KR)

(*) Notice: Subject to any disclaimer, the term of this patent is extended or adjusted under 35 U.S.C. 154(b) by 0 days.

(21) Appl. No.: 15/778,008

(22) PCT Filed: Nov. 23, 2016

(86) PCT No.: PCT/KR2016/013545
§ 371 (c)(1),
(2) Date: May 22, 2018

(87) PCT Pub. No.: WO2017/090977
PCT Pub. Date: Jun. 1, 2017

(65) Prior Publication Data
US 2018/0352688 A1 Dec. 6, 2018

(30) Foreign Application Priority Data
Nov. 23, 2015 (KR) .................. 10-2015-0164240
Nov. 27, 2015 (KR) .................. 10-2015-0167455

(51) Int. Cl.
H05K 9/00 (2006.01)
H02J 50/10 (2016.01)
(Continued)

(52) U.S. Cl.
CPC .......... H05K 9/0075 (2013.01); H01F 1/147 (2013.01); H01F 1/153 (2013.01); H01F 1/34 (2013.01);
(Continued)

(58) Field of Classification Search
CPC combination set(s) only.
See application file for complete search history.

(56) References Cited

U.S. PATENT DOCUMENTS

2001/0015239 A1* 8/2001 Kanekiyo ............ B82Y 25/00
148/104
2014/0028111 A1* 1/2014 Hansen ................ H01F 38/14
307/104

(Continued)

FOREIGN PATENT DOCUMENTS

CN 104900383 A 9/2015
JP 10-229007 A 8/1998
(Continued)

OTHER PUBLICATIONS

Yoshida et al., JP 2007-295557 Translation (Year: 2007).*
PCT International Search Report dated Feb. 20, 2017 for International Application No. PCT/KR2016/013545; 4 Pages.

Primary Examiner — Nay A Maung
Assistant Examiner — Erica L Fleming-Hall
(74) Attorney, Agent, or Firm — Daly, Crowley, Mofford & Durkee, LLP

(57) ABSTRACT

A magnetic field shielding unit according to one embodiment of the present disclosure comprises: a first shielding sheet having a first magnetic field shielding layer formed of fragments of an Fe-based alloy to enhance an antenna characteristic for wireless charging in order to enhance flexibility and reduce an eddy current; and a second shielding sheet having a second magnetic field shielding layer formed of fragments of ferrite to enhance an antenna characteristic for short range communication in order to enhance the flexibility of the shielding unit. According to the present disclosure, the shielding unit is complexly configured to enhance all of the characteristics of different types of antennas operating in different frequency bands so that the shield- (Continued)

ing unit can significantly enhance the transmission/reception distance and efficiency of a signal and can be implemented to be very slim; the flexibility of the shielding is enhanced, which makes it possible to prevent additional micro-cracks of a magnetic material and fragmentation thereof, thus preventing a magnetic material and fragmentation thereof, thus preventing a magnetic permeability decrease in the operating frequency band of an antenna in advance; and the shielding unit can adhere firmly to an object having a step so that it is possible to solve a problem of separation of th shielding unit.

16 Claims, 7 Drawing Sheets

(51) Int. Cl.
| | | |
|---|---|---|
| H01Q 1/52 | (2006.01) | |
| H04B 5/00 | (2006.01) | |
| H01F 1/147 | (2006.01) | |
| H01F 1/153 | (2006.01) | |
| H01F 1/34 | (2006.01) | |
| H01F 27/36 | (2006.01) | |
| H01F 38/14 | (2006.01) | |
| H02J 7/02 | (2016.01) | |
| H01Q 1/24 | (2006.01) | |

(52) U.S. Cl.
CPC .......... *H01F 27/36* (2013.01); *H01F 38/14* (2013.01); *H01Q 1/52* (2013.01); *H02J 7/02* (2013.01); *H02J 50/10* (2016.02); *H04B 5/0031* (2013.01); *H04B 5/0037* (2013.01); *H05K 9/00* (2013.01); *H01Q 1/243* (2013.01); *H01Q 1/526* (2013.01); *H02J 7/025* (2013.01)

(56) References Cited

U.S. PATENT DOCUMENTS

| | | | |
|---|---|---|---|
| 2014/0065948 A1* | 3/2014 | Huang | H04B 1/3888 455/7 |
| 2016/0064814 A1* | 3/2016 | Jang | H01Q 1/526 343/842 |
| 2016/0156103 A1* | 6/2016 | Bae | H02J 50/20 320/108 |
| 2016/0181695 A1* | 6/2016 | Mukherjee | H01Q 1/2216 343/866 |
| 2017/0372836 A1* | 12/2017 | Jeong | H02J 50/12 |
| 2018/0254140 A1* | 9/2018 | Lee | H02J 50/12 |
| 2018/0315527 A1* | 11/2018 | Lee | H01F 1/10 |

FOREIGN PATENT DOCUMENTS

| | | |
|---|---|---|
| JP | 2007-295557 A | 11/2007 |
| JP | 2008-021991 A | 1/2008 |
| JP | 2009-099809 A | 5/2009 |
| KR | 10-2014-0065364 A | 5/2014 |
| KR | 10-2015-0050541 A | 5/2015 |

* cited by examiner

MAGNETIC FIELD SHIELDING UNIT AND MULTI-FUNCTIONAL COMPLEX MODULE INCLUDING SAME

CROSS-REFERENCE TO RELATED APPLICATION

This application is a U.S. National Stage of PCT/KR2016/013545 filed in the Korean language on Nov. 23, 2016, entitled: "MAGNETIC FIELD SHIELDING UNIT AND MULTI-FUNCTIONAL COMPLEX MODULE INCLUDING SAME" which application claims priority to Korean Application No. 10-2015-0167455 filed on Nov. 27, 2015 and Korean Application No. 10-2015-0164240 filed on Nov. 23, 2015, which applications are each hereby incorporated herein by reference in their entireties.

BACKGROUND

1. Technical Field

The present disclosure relates to a magnetic field shielding unit, and more particularly, to the magnetic field shielding unit and a multifunctional integrated module including the same having a slimed thickness, which is integrated to improve heterogeneous antenna characteristics having different operating frequency bands.

2. Discussion of the Related Art

Near Field Communication (NFC) is a technology that transmits data between terminals at a distance of 10 cm by using a non-contact type short distance wireless communication module using frequency band of 13.56 MHz as one of RFID. NFC is widely used in payment, market, travel information, traffic, access control, lock, and the like. As a feature of the NFC, the terminal having a built-in tag can be operated in an active mode as a concept expanded from the existing RFID, so that the function as the tag, a READER for reading the tag, a WRITER for inputting information in the tag, and P2P between the terminals are possible. Accordingly, it becomes common to mount the short range wireless communication module in a portable electronic device such as a mobile phone, a PDA (personal digital assistant), an iPad, a notebook computer, or a tablet PC so as to enable short distance communication.

In addition, a non-contact wireless charging type portable terminal using a magnetic induction method has been widely used, and accordingly various other functions are required. As a technology that allows users to charge more easily, there is an increasing tendency for portable terminal to be equipped with the non-contact wireless power transmission module.

Such wireless charging is performed by a wireless power reception module built in the portable terminal and the wireless power transmission module for supplying power to the wireless power reception module.

Recently, there is a tendency that a combo antenna unit including different types of antennas that perform the respective function is installed in the portable terminal to perform both of the short distance wireless communication and the wireless power transmission of the portable terminal battery. Such combo antenna unit generates a magnetic field of 100 kHz to several tens of MHz in the course of performing the short distance wireless communication with nearby portable terminal or charging the battery.

The conventional magnetic bodies provided in the magnetic field shielding sheet have different permeability curves for different frequencies. For example, the permanent magnets provided in the magnetic field shielding sheet may exhibit a high permeability and a relatively low loss permeability in a specific frequency band. In other frequency bands, conversely, the permanent magnets may have low permeability and high loss permeability. Therefore, in order to maximize the antenna function, the magnetic field shielding sheet capable of exhibiting excellent magnetic properties (high permeability and low loss permeability) in the operating frequency band of the antenna should be selected.

On the other hand, in the above-mentioned combo type antenna unit, the short distance wireless communication and the wireless power transmission may use different frequency bands for transmission and reception of data signal or power signal. Specifically, the short distance wireless communication uses a frequency band of 13.56 MHz for data signal transmission. The wireless power transmission uses a frequency band of 10 kHz to 400 kHz for transmission and reception of wireless power signals.

Since the gap between the frequency bands used in the above two functions is very wide, the magnetic body does not exhibit excellent magnetic properties (high permeability and low loss permeability) to cover all the frequency bands of 10 kHz to 400 kHz and 13.56 MHz as a single material. Accordingly, the magnetic field shielding sheet is realized by providing two types of magnetic bodies, for example, an amorphous alloy and ferrite, which exhibit excellent magnetic characteristics at respective desired frequencies.

However, the amorphous alloy has a large loss due to eddy currents. In addition, the heat-treated amorphous alloy and ferrite tend to be broken and divided into fragments. In addition, as the portable device has a tendency of small size and slim thickness in commercialized, the magnetic field shielding sheet is required to have small size and slim thickness. When the magnetic body is broken and divided into fragments, the magnetic properties may exhibit lower than the initial designed physical property. Therefore, the function of the module may not be exerted at a desired level.

Thus, even if the magnetic field shielding sheet is thinned, the change or deterioration of physical properties such as the initial designed permeability due to the storage, transportation, adhering to the adhered of the shielding sheet, and additional cracks of the magnetic body during use of the electronic device provided with a thing to be adhered should be prevented. In addition, it is required to develop the magnetic shielding material capable of satisfying heterogeneous antenna characteristics having different operating frequencies.

SUMMARY

To solve the above problem and defects, it is an object of the present disclosure to provide a magnetic field shielding unit capable of improving all kinds of antenna characteristics having different operating frequency bands and having no characteristic change such as bending of the adhered surface.

It is another object of the present disclosure to provide a magnetic field shielding unit having a thin thickness, while satisfying all kinds of antenna characteristics, and suitable for electronic devices that are thin and small.

It is still another object of the present disclosure to provide a multifunctional integrated module capable of improving the characteristics of each antenna and having improved durability even though heterogeneous antennas having different frequency bands at different operating frequencies are provided.

Furthermore, it is still another object of the present disclosure to provide a portable device in which a signal receiving efficiency and a receiving distance are remarkably increased by including a multifunctional integrated module according to the present disclosure as a receiving module.

According to an aspect of the present disclosure, there is provided a magnetic field shielding unit; a first shielding sheet, for improving characteristics of a wireless power transmission antenna, including a first magnetic field shielding layer formed of fragments of shredded Fe-based alloy to improve the flexibility of the shielding unit and to reduce generation of eddy currents, a second shielding sheet, for improving characteristics of a short distance communication antenna, including a second magnetic field shielding layer formed of fragments of shredded ferrite to improve the flexibility of the shielding unit and a receiving portion to receive a partial or an entire thickness of the first shielding sheet; wherein a value according to following Equation 1 for an average diameter of fragments of Fe-based alloy and an average diameter of fragments of ferrite are 3 to 35.

Average diameter of fragments of ferrite (μm)/Average diameter of fragments of Fe-based alloy (μm) [Equation 1]

In an embodiment of the present disclosure, the receiving portion may be a receiving recess recessed from a surface of the second shielding sheet to a predetermined depth, or a through hole penetrating the second shielding sheet.

In an embodiment of the present disclosure, the first magnetic field shielding layer may include a dielectric filling at least a part of gaps between adjacent Fe-based alloy fragments.

In an embodiment of the present disclosure, the first shielding sheet may include a first magnetic field shielding layers, and a dielectric layer may be interposed between adjacent the first magnetic field shielding layers to adhere the magnetic field shielding layers to each other.

In an embodiment of the present disclosure, the Fe-based alloy fragments may have an average diameter of 0.5 μm to 700 μm.

In an embodiment of the present disclosure, the number of Fe-based alloy fragments of which diameter may be less than 500 μm may be 60% or more of the total number of the Fe-based alloy fragments.

In an embodiment of the present disclosure, the first magnetic field shielding layers may have a thickness of 15 μm to 50 μm.

In an embodiment of the present disclosure, the first shielding sheet may include the first magnetic field shield layers of 2 to 12.

In an embodiment of the present disclosure, the second shielding sheet may have a quality index value of 20 or more at an operating frequency of 13.56 MHz according to following Equation 2.

A quality index value=a real part of complex permeability at a predetermined frequency (μ')+an imaginary part of complex permeability at a predetermined frequency (μ") [Equation 2]

In an embodiment of the present disclosure, the second magnetic field shielding layer may have a thickness of 30 μm to 600 μm.

In an embodiment of the present disclosure, the average diameter of a single fragment of the ferrite fragments may be 100 μm to 2100 μm.

In an embodiment of the present disclosure, the value according to the Equation 1 may be 3 to 25.

To solve the above problem and defects, the present disclosure provides a multifunctional integrated module that includes an antenna unit including a short distance communication antenna and a wireless power transmission antenna, and a magnetic field shielding unit, disposed on a surface of the antenna unit, configured to improve characteristics of the antennas and condense a magnetic flux toward the antennas.

In an embodiment of the present disclosure, the number of the Fe-based ally fragments having at least one side of curved shape may be 15% or more of the total number of the Fe-based alloy fragments.

In an embodiment of the present disclosure, the number of the ferrite fragments having at least one side of curved shape may be 25% or more of the total number of the ferrite fragments.

In an embodiment of the present disclosure, the wireless power transmission antenna may be formed inside the short distance communication antenna, and the first shielding sheet of the magnetic field shielding unit may be provided to correspond to the wireless power transmission antenna.

In an embodiment of present disclosure, the antenna unit may further include a magnetic security transmission (MST) antenna, and the first shielding sheet may be provided to correspond to the magnetic security transmission antenna.

In an embodiment of present disclosure, the present disclosure provides a portable device including the multifunctional integrated module as a receiving module.

According to an aspect of the present disclosure, there is provided a magnetic field shielding unit that includes a first shielding sheet, for improving the characteristics of a wireless power transmission antenna, including a first magnetic field shielding layer formed of fragments of a shredded Fe-based alloy to improve a flexibility of the shielding unit and to reduce generation of eddy currents, and a second shielding sheet, for improving the characteristics of a short distance communication antenna, including a second magnetic field shielding layer formed of fragments of a shredded ferrite to improve the flexibility of the shielding unit and to receive a part thickness or an entire thickness of the first shielding sheet, wherein the fragments of Fe-based alloy and ferrite may have at least one side of curved shape in order to prevent further fragmentation.

In an embodiment of present disclosure, the first shield sheet and the second shield sheet may further include a protective member disposed on the upper portion of the uppermost magnetic field shielding layer, and an adhesive member disposed on the lower portion of the lowermost magnetic field shielding layer.

According to the present disclosure, the magnetic field shielding unit is integrated to satisfy all of the heterogeneous antenna characteristics having different frequency bands as the operating frequency, thereby improving the transmission/reception distance and transmission/reception efficiency of signals. Further, due to the improvement in the flexibility of the shielding unit, the additional fine cracks and fragmentation of the magnetic body may be prevented, so that the magnetic permeability change in the operating frequency band of the antenna can be prevented in advance. It is also excellent in adherence to an adhered having a step, so that deterioration in durability due to peeling of the shielding unit can be prevented.

Thus, the magnetic field shielding layer according to the present disclosure may be very advantageous to realize the portable device of slim module.

Thus, since the multifunctional integrated module according to the present disclosure can perform different functions such as the short distance communication, the wireless power transmission, the magnetic security transmission, and the like as a single module, it can be widely applied to various portable devices and electronic devices such as various mobile devices, smart household appliances, or internet of things devices.

BRIEF DESCRIPTION OF THE DRAWINGS

FIG. 1 is a cross-sectional view of a magnetic field shielding unit according to an embodiment of the present disclosure.

FIG. 6A is a view showing a manufacturing process using the shredding device for shredding the ferrite sheet through unevenness provided on a roller, and FIGS. 6B and 6C are views showing the manufacturing process using the shredding device for shredding the sheet or the ferrite through metal balls provided on a support plate.

FIG. 7 is a view of a multifunctional integrated module according to an embodiment of the present disclosure.

DETAILED DESCRIPTION OF THE EMBODIMENTS

Figure 1A:
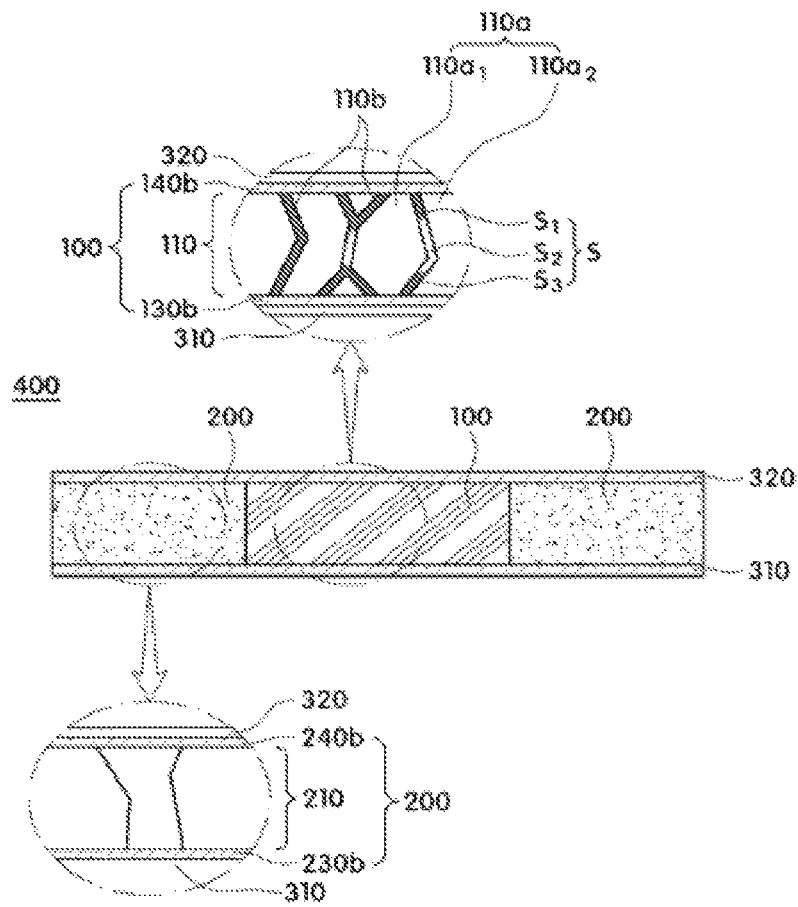
FIG. 1A is a cross-sectional view showing the magnetic field shielding unit having a first shielding sheet in a receiving portion of a second shielding sheet formed with a through-hole.

Hereinafter, exemplary embodiments of the present disclosure will be described in detail with reference to the accompanying drawings, which will be readily apparent to those skilled in the art to which the present disclosure pertains. The present disclosure may be embodied in many different forms and is not limited to the embodiments described herein. In the drawings, parts not relating to the description are omitted for clarifying the present disclosure, and the same reference numerals are assigned to the same or similar components throughout the specification.

As shown in FIG. 1a, the magnetic field shielding unit 400 according to an embodiment of the present disclosure may include a first shielding sheet 100 and a second shielding sheet 200 having a receiving portion formed with a through hole for receiving the first shielding sheet 100. Protective members 310 and 320 may be disposed on upper and lower portions of the first and second shielding sheets 100 and 200, respectively.

Figure 1B:
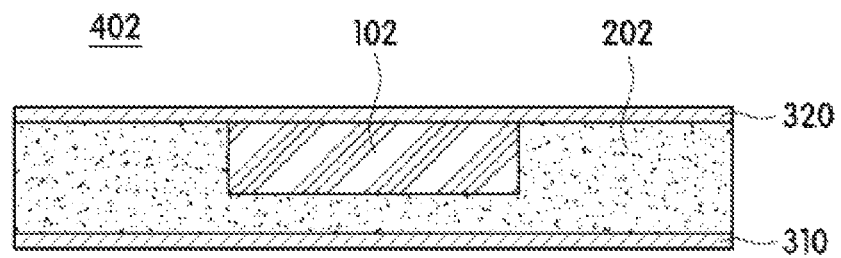
FIG. 1B is a cross-sectional view showing the magnetic field shielding unit having the first shielding sheet in the receiving portion of the second shielding sheet formed of a receiving recess recessed by the thickness of the sheet.
Figure 1C:
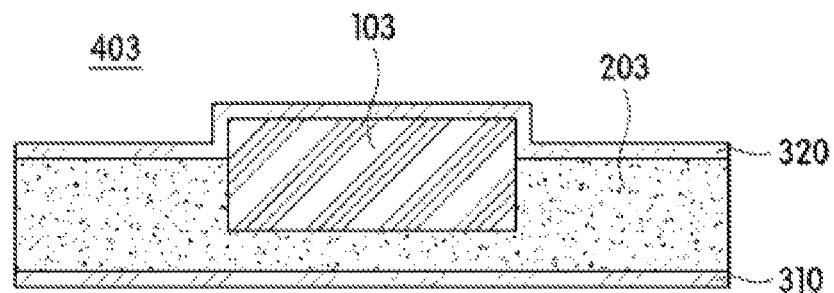
FIG. 1C is a cross-sectional view showing the magnetic field shielding unit having the first shielding sheet in the receiving portion of the second shielding sheet formed of the receiving recess recessed by the thickness smaller than the thickness of the first shielding sheet.

Further, as shown in FIGS. 1B and 1C, the second shielding sheet 202 may be formed with a receiving recess recessed to a predetermined depth to receive the first shielding sheet. The depth of the receiving recess may be equal to the thickness of the first shielding sheet 102 as shown in FIG. 1B, so that the shielding unit 402 may be formed such that no step is formed on the first shielding sheet 102 and the second shielding sheet 202. The depth of the receiving recess provided in the second shielding sheet 203 is shallower than the thickness of the first shielding sheet 103 and the shielding unit 402 may be formed so that a step is formed on the upper portion of the first shielding sheet 103 and the second shielding sheet 203.

The first shielding sheet 100 may improve an antenna characteristic with a frequency band of 10 to 400 kHz as the operating frequency. More preferably the antenna may be a wireless power transmission antenna. Further, the antenna may be an antenna for performing a heterogeneous function having an operating frequency band, for example, a magnetic secure transmission antenna.

As shown in FIG. 1A, the first shielding sheet 100 may include a first magnetic field shielding layer 110. The first magnetic field shielding layer 110 may include Fe-based alloy fragments 110a and dielectrics 110b which are filled in at least partial gaps $S_1$ and/or $S_3$ of all the gaps S between adjacent the Fe-based alloy fragments $110a_1$ and $110b_2$.

The magnetic field shielding layer 110 may be formed of fragments 111 of a shredded Fe-based amorphous alloy in order to improve the flexibility of the shielding unit and reduce eddy currents. As shown in FIG. 1A, the magnetic field shielding layer 110 may be formed of shredded Fe-based alloy fragments 110a, which may provide a significantly increased specific resistance of the magnetic field shielding layer 110 compared with a case that the magnetic field shielding layer 110 is formed in a single uniform shape, for example, the ribbon sheet shape, and thus can minimize the magnetic loss due to eddy currents. The specific resistance value may vary depending on the type of the magnetic material, and the magnetic material having a significantly larger specific resistance such as ferrite may be less susceptible to magnetic loss due to the eddy currents. On the other hand, the Fe-based alloy, which is a magnetic material according to the embodiment of the present disclosure, may have a small specific resistance and a large magnetic loss due to the eddy current. Thus, if the magnetic field shielding layer 110 is made in a form of ribbon sheet, it may be difficult to obtain a desired level of physical properties. However, the shredded Fe-based alloy fragments obtained by shredding the ribbon sheet may have a significantly increased specific resistance due to the gaps between the shredded fragments and the decreased magnetic loss due to the eddy current. Thus, the reduction of the permeability due to fragmentation and the reduction of the inductance of the radiator due to the reduction of the permeability may be compensated.

Meanwhile, the magnetic field shielding layer 110 formed of the shredded fragments 110a may have good flexibility. The Fe-based alloy, for example, the Fe-based alloy ribbon sheet may be easily fragmented when the ribbon sheet subjected to the heat treatment process for adjusting the permeability is brittleness and be easily fragmented or bent when an impact is applied to the ribbon sheet.

However, the first shielding sheet 100 included in an embodiment of the present disclosure may be remarkably improved in flexibility. The reason is that the Fe-based alloy ribbon sheet may be provided in a shredded and fragmented state at the beginning. Even if the thickness of the magnetic field shielding unit is thinned, the risk that cracks may be further generated in the Fe-based alloy fragments due to the external force may be blocked.

The 3-element based alloy may include silicon (Si) and boron (B) in addition to iron (Fe). Any other element such as chromium (Cr), cobalt (Co), or nickel (Ni) may be further added to the basic composition of the 3-element based alloy, to improve other characteristics, for example, the characteristic of corrosion resistance.

The 5-element based alloy may include iron (Fe), copper (Cu), niobium (Nb) silicon (Si) and boron (B). The copper may improve the corrosion resistance of the Fe-based alloy, prevent the size of the crystal from becoming larger even when crystals are generated, and improve magnetic properties such as magnetic permeability.

The Fe-based alloy fragments may be provided by shredding an Fe-based alloy ribbon, wherein the Fe-based alloy ribbon thickness may be 15 to 35 µm, and the thicker ribbon may prevent the alloy from becoming amorphous. The Fe-based ribbon may be subjected to a heat treatment process to improve magnetic properties such as permeability. The treatment temperature and the treatment time in the heat treatment process may vary depending on the specific composition ratio of the Fe-based alloy ribbon and the desired permeability, and the present disclosure is not particularly limited thereto. On the other hand, as the brittleness of the heat-treated Fe-based ribbon increases, the ribbon may be broken in the process of storing and transporting. In order to prevent this, the thickness of the ribbon may be preferably 25 µm to 30 µm.

Further, the magnetic body included in the conventional magnetic shield member is advantageous for shielding the magnetic field as the magnetic permeability is higher. However, the relationship between magnetic permeability and antenna characteristics may not be regarded as a simple proportional relationship. Therefore, even if the permeability is too high, it is impossible to improve the antenna (ex. wireless power transmission) characteristic having the frequency band including the desired frequency of 10 kHz to 400 kHz as the operating frequency. Specifically, the magnetic body having a high magnetic permeability in a frequency band including 10 kHz to 400 kHz may improve the inductance characteristic of the antenna when combined with the wireless power transmission antenna and may further increase the improvement in the specific resistance characteristic of the antenna more than the improvement range of the inductance characteristic. In this case, the degree of enhancement of the antenna characteristic may be rather small, so that the antenna characteristic may not be improved to the desired level. Accordingly, it is preferable that the magnetic-field shielding layer is provided with a Fe-based alloy having an appropriate permeability and loss permeability so as to improve the inductance of the antenna when the magnetic field shielding unit is combined with a specific antenna and minimize the increase in specific resistance.

The particle diameter of the Fe-alloy fragments may be 0.5 µm to 700 µm, preferably 0.5 µm to 650 µm. The particle diameter of the Fe-alloy fragments may mean the longest distance from one point to the other point on the surface of the fragment. The particle size of the fragment means the longest length of the line included in the outer surface of the fragment. The line included in the outer surface means a case where all points forming a line are present on the outer surface, and a line in which some points forming a line exists outside the outer surface is excluded from a line included in the outer surface. Here, in the particle diameter distribution of the Fe-based alloy fragments, the number of fragments having a particle diameter of less than 500 m may be 60% or more, more preferably 80% or more of the total number of fragments. If the number of fragments having a particle diameter of less than 500 µm is less than 60% of the total number of fragments, the Fe-based alloy has a high permeability, and even if it induces the improvement of the inductance characteristic of the radiator, the specific resistance property of the radiator may be further increased. The degree of improvement of the radiator characteristics may be very small, and a heat generation problem due to the eddy current may occur, or a performance of the magnetic field shielding unit may be deteriorated due to a magnetic leakage. Particularly, additional fine fragmentation of the Fe-based alloy due to an external force may be caused, which may lead to a changing or a decreasing in designed physical properties.

Next, a description will be given with respect to the dielectric 110b which is filled in at least a part of gaps between the adjacent fragments among the above-mentioned Fe-based alloy fragments 110a.

The dielectric 110b may further minimize eddy currents generated by partially or totally insulating adjacent Fe-based alloy fragments and prevent the fractured Fe-based alloy fragments 110a from moving within the magnetic field shielding layer 110 by holding and supporting the Fe-based alloy fragments. In addition, the dielectric 110b may function to prevent the amorphous alloy from being oxidized by moisture penetration. The dielectric 110b may further function as a shock absorber to prevent the fragments 110a from being additionally broken or fragmented when an external force is applied to the magnetic field shielding layer.

Figure 2:
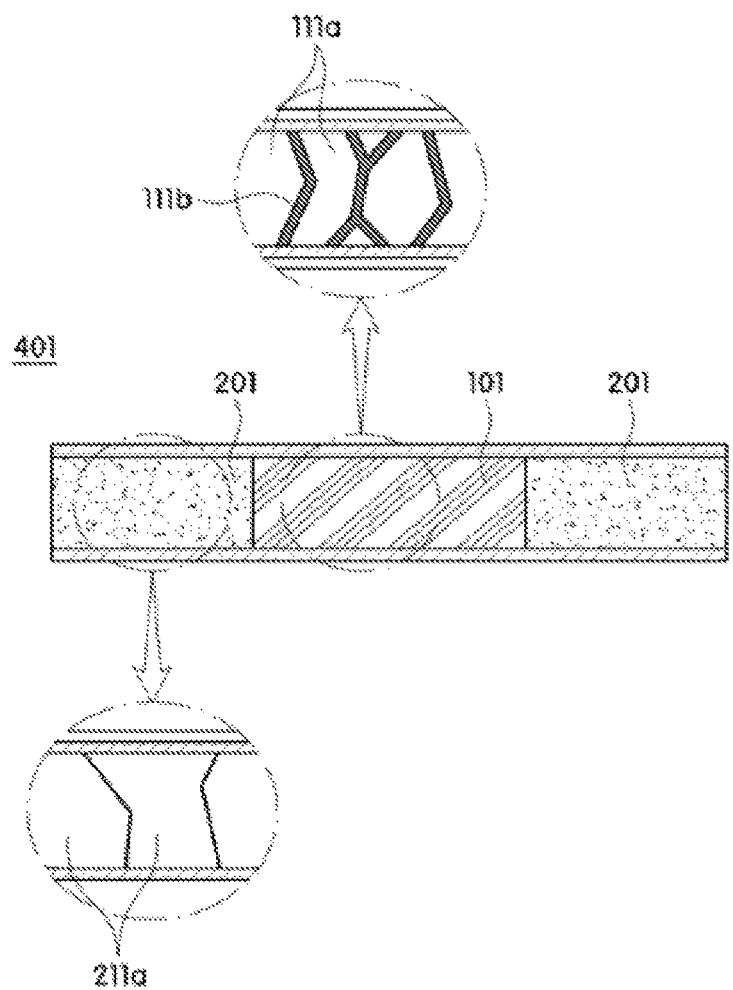
FIG. 2 is a cross-sectional view of the magnetic field shielding unit according to an embodiment of the present disclosure, showing that a dielectric is filled in all of the gaps between fragments of Fe-based alloy.

As shown in FIG. 1A, the dielectrics 110b may be filled in the partial spaces $S_1$ and $S_3$ of gaps between the first Fe-based alloy fragment $110a_1$ and the second Fe-based alloy fragment $111a_2$. A partial space $S_2$ of the gaps may remain in an empty space without being filled with the dielectric 110b, thereby partially insulating the Fe-based alloy fragment. On the other hand, as shown in FIG. 2, the dielectric 111b may be filled in all of the gaps between adjacent fragments to insulate all of the Fe-based alloy fragments.

The material of the dielectric 110b and 111b may be a material that is commonly known as a dielectric, and a material having adhesiveness in terms of fixing the Fe-based alloy fragments. The material having such physical property may be used without limitation. As a non-limiting example, the dielectric 110b and 111b may be a composition that is formed by hardening the dielectric forming composition, by cooling after melting by heat, or by exhibiting an adhesive force at room temperature under pressure. As an example of a composition that is hardened to form a dielectric, the dielectric forming composition may include at least one of a thermoplastic resin and a thermosetting resin and may include a hardening agent. In addition, the dielectric forming composition may further include a hardening accelerator and a solvent.

Specifically, the thermoplastic resin may be at least one selected from the group consisting of polyethylene, polypropylene, polystyrene, polyvinyl chloride, acrylonitrile-butadiene-styrene resin (ABS), acrylonitrile-styrene resin (AN), acrylic resin, methacrylic resin, polyamide, polyethylene terephthalate (PET), polybutylene terephthalate (PBT), phenoxy resin, polyurethane resin, nitrile butadiene resin, and the like.

The thermosetting resin may include at least one of a phenol resin (PE), a urea resin (UF), a melamine resin (MF), an unsaturated polyester resin (UP) and an epoxy resin and the like, preferably, may be an epoxy resin. Examples of the epoxy resin may include multifunctional epoxy resin such as bisphenol A type, bisphenol F type, bisphenol S type, canceled bisphenol A type, hydrogenated bisphenol A type, bisphenol AF type, biphenyl type, naphthalene type, fluorene type, phenol novolak type, novolak type, trishydroxylphenylmethane type, tetraphenylmethane type and the like which may be used alone or in combination.

When the thermosetting resin is used in combination with a thermoplastic resin, the content of the thermosetting resin may be 5 to 95 parts by weight per 100 parts by weight of the thermoplastic resin.

The hardening agent may be used without any particular limitation as long as it is a known one. As a non-limiting example, amine compound, phenol resin, acid anhydride, imidazole compound, polyamine compound, hydrazine compound, dicyandiamide compound, etc. may be used alone or in combination of two or more. The hardening agent may be preferably composed of at least one material selected from an aromatic amine compound hardening agent and a phenol resin hardening agent. The aromatic amine compound hardening agent or the phenolic resin hardening agent may have the advantage of less change in adhesion property even when stored at room temperature for a long period of time. Examples of the aromatic amine compound hardening agent may include m-xylene diamine, m-phenylenediamine, diaminodiphenylmethane, diaminodiphenylsulfone, diaminodearyl diphenylmethane, diaminodiphenyl ether, 1,3-bis [(4-aminophenoxy)phenyl]sulfone, 4,4'-bis(4-aminophenoxy)-aminophenoxy) biphenyl, 1,4-bis(4-aminophenoxy) benzene, and the like, which may be used alone or in combination. Examples of the phenol resin hardening agent may include phenol novolak resin, cresol novolak resin, bisphenol A novolak resin, phenol aralkyl resin, poly-p-vinylphenol t-butylphenol novolak resin, and naphthol novolak resin, which may be used alone or in combination. The content of the hardening agent may be preferably 20 to 60 parts by weight per 100 parts by weight of at least one of the thermoplastic resin and the thermoplastic resin. When the content of the hardening agent is less than 10 parts by weight, the effect of hardening on the thermosetting resin may be insufficient and the heat resistance may be lowered. On the other hand, when the content of the hardening exceeds 60 parts by weight, the reactivity with the thermosetting resin may be high, and the physical properties such as handling and long-term storage of the magnetic field shielding unit may be deteriorated.

The hardening agent may be used without any particular limitation as long as it is a known one. As a non-limiting example, amine compound, phenol resin, acid anhydride, imidazole compound, polyamine compound, hydrazide compound, dicyandiamide compound, etc. may be used alone or in combination of two or more. The content of the hardening agent is preferably about 0.1 to 10 parts by weight, and more preferably 0.5 to 5 parts by weight per 100 parts by weight of at least one of the thermoplastic resin and the thermosetting resin.

The dielectrics 110b and 111b formed through the above-described dielectric composition may be formed by permeating a part of at least one of the first adhesive layer 140b and the second adhesive layer 130b, described later, into the gaps between the Fe-based alloy fragments. The composition of the dielectric 110b and 111b and the composition of at least one of the first adhesive layer 140b and the second adhesive layer 130b may be the same.

The thickness of the first magnetic field shielding layer 110 may be the thickness of the Fe-based amorphous alloy ribbon which is the origin of the above-mentioned Fe-based alloy fragments. Except for the gaps between fragments and the thickness of the dielectric covering the top or bottom of some fragments, the thickness of the first magnetic field shielding layer 110 may be 15 µm to 50 µm, but is not limited thereto.

The shape of the first magnetic field shielding layer may be a circle, an ellipse, a polygonal shape such as a pentagon, etc. as well as a rectangular shape or a square shape, or a shape in which a curved line and a straight line are partly mixed, so as to correspond to the shape of the application to which the first magnetic field shielding layer is applied. For example, the shape of the magnetic field shielding layer may have the same shape (Ex. Ring shape) corresponding to the shape of the antenna. Here, it is preferable that the size of the first magnetic field shielding layer may be about 0.1 mm to 2 mm larger than that of the antenna.

Figure 3:
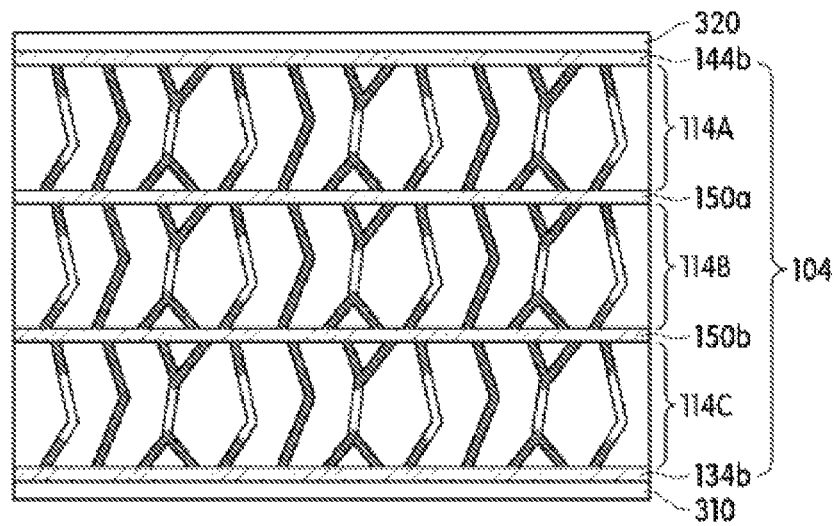
FIG. 3 is a cross-sectional view of the first shielding sheet included in one embodiment of the present disclosure, showing the first shielding sheet having three first magnetic field shielding layers.

Meanwhile, as shown in FIG. 3, a plurality of magnetic shielding layers 114A, 114B and 114C including the first magnetic field shielding layer may be provided in the first magnetic field shielding unit. Dielectric layers 150a and 150b for reducing eddy currents may be interposed between adjacent magnetic field shielding layers 114A/114B and 114B/114C.

In some cases, when only a single magnetic shielding layer is provided on the first shielding sheet 104, it may not be suitable for functions such as wireless power transmission and magnetic security transmission. Accordingly, a plurality of the magnetic shielding layers 114A, 114B, and 114C may be provided to increase the thickness and achieve the same effect of increasing the physical properties as using a magnetic material having a high magnetic permeability.

When a plurality of magnetic field shielding layers is provided in the first shielding sheet 104, it is preferable that the number of magnetic field shielding layer may include 2 to 12 layers, more preferable 3 to 6 layers, but is not limited thereto. On the other hand, even increasing the number of laminating of the magnetic field shielding layers infinitely, the desired level of physical properties may not be achieved. If the number of laminating of the magnetic field shielding layer exceeds 12, the improvement of the quality index may be minimal. Further, its thickness may become thicker, which may be undesirable in reducing the thickness of the magnetic field shielding unit.

Meanwhile, the dielectric layers 150a and 150b may be dielectric adhesive layers, and the dielectric adhesive layer may be formed through the dielectric forming composition described above. When a plurality of the magnetic field shielding layers 114A, 114B, and 114C are provided, a plurality of Fe-based alloy ribbons may be laminated via the dielectric adhesive layer 150, and the ribbon may be shredded to form a first shielding sheet 104. In this case, the dielectric included in the lower portion of the adjacent magnetic field shielding layer 114A and the upper portion of the magnetic field shielding layer 114B may be formed in such a manner that the dielectric adhesive layer 150a penetrate into the gaps between the Fe-based fragments located in the lower portion of the magnetic field shielding layer 114A and upper portion of the magnetic field shielding layer 114B. Preferably, the dielectric adhesive layers 150a and 150b may have a thickness of 1 to 10 μm and an adhesive force of about 700 to 900 g·f/inch. The dielectric adhesive layer 150a and 150b may be a double-sided tape having an adhesive layer formed on both sides of a supporting member (not shown) or may be composed of an adhesive layer without a supporting member. The support member may not be included for thinning the first shielding sheet 104.

In another embodiment, the dielectric layers 150a and 150b may be a heat-radiation adhesive layer. The heat-radiation adhesive layer may be formed by mixing known heat radiation filler such as nickel, silver, or carbon with an adhesive component such as an acrylic, urethane and epoxy resin. The specific composition and content thereof may be in accordance with known compositions and contents, and thus the present disclosure is not particularly limited thereto.

When a plurality of the magnetic shielding layers 110A, 110B, and 110C are provided, the composition of the Fe-based amorphous alloy included in each of the magnetic field shielding layers may be the same or different. The compositions of the Fe-based amorphous alloys may be the same or different. Also, even though the composition is the same, the magnetic permeability of each of the magnetic shielding layers may be different due to the difference in the heat treatment time and the like. The thickness of each of the magnetic field shielding layers may be the same or different depending on the purpose.

Next, the second shielding sheet 200 may include the second magnetic field shielding layer 210, and the magnetic field shielding layer 210 may be formed of a plurality of fragments 210a of ferrite.

First, the second magnetic field shielding layer 210 is formed of ferrite fragments 210a, which are formed by shredding the ferrite sheet to improve the flexibility of the second shielding sheet 200.

In order to make the magnetic field shielding unit slimmer and thinner, the thickness of each sheet provided and the thickness of the magnetic body to be provided must be very thin at the same time. Ferrite suitable for an antenna having an operating frequency band of 13.56 MHz may have brittleness. The ferrite containing magnesium oxide may be easily broken. When the thickness of the ferrite sheet is thin, the ferrite sheet may be cracked even by a weak external force. Therefore, having been cracked, the ferrite sheet may have changed the magnetic properties such as the magnetic permeability compared to those prior to being cracked.

In addition, the magnetic field shielding unit having a thin ferrite structure is required to be handled to prevent cracking, when it is stored, transported, and put into the assembly process, but such handling may significantly reduce workability. In addition, even when a portable device is manufactured with great efforts to prevent cracks from occurring in the ferrite sheet, the ferrite sheet may be cracked or broken by an impact due to dropping of the portable device during using. Therefore, there is a problem in that it may not guarantee transmission/reception efficiency and transmission/reception distance of various data signals.

However, the ferrite 210a which is the magnetic body included in the magnetic shielding unit according to an embodiment of the present disclosure may be remarkably improved in flexibility. The reason is that the second shielding sheet is provided in a shredded and fragmented state at the beginning. Even if the thickness of the second shielding unit is thinned, the risk that cracks may be further generated in the ferrite fragments due to the external force can be blocked at its source. In addition, the second shielding sheet 200 including the ferrite in the fragment state retains the initial property enough to exhibit excellent characteristics in signal transmission/reception efficiency and transmission/reception distance of the antenna having the operating frequency band of 13.56 MHz from the beginning. Since the initial physical property value may be continuously maintained in the manufacturing step of the finished product to which the magnetic field shielding unit 300 is installed and in the using stage of the finished product, it is possible to fundamentally eliminate deterioration of the physical property and significant reduction in the performance of power signal transmission and reception due to the deterioration due to unintentional fragmentation occurring in the magnetic field shielding unit having the ordinary non-shredded magnetic body.

On the other hand, the fragments of ferrite 210a may have irregular shapes. In addition, the average particle diameter of the single fragment of the ferrite fragments may be 100 μm to 2100 μm. If the average particle diameter exceeds 2100 μm, it is difficult to maintain the initial design property of the second shielding sheet 200 due to an increase in breakage and fragmentation of additional fragments. If the average particle diameter of the fragments is less than 100 μm, it is necessary to select a ferrite having a high magnetic property value such as magnetic permeability of the ferrite before shredding. However, since there is a manufacturing limitation to manufacture a ferrite having a high magnetic permeability, it is difficult to design the initial physical properties. On the other hand, the average particle diameter of the fragments is a result measured based on the longest diagonal line among the diagonal lengths of the test pieces distributed on the diagonal reference line within the area of 4 mm×4 mm. On the other hand, even if the ferrite particles having a curved shape are not included, the magnetic particle shielding unit itself may not exhibit the desired effect because the particle size is less than 100 μm, or particle diameter is excessively small.

On the other hand, the ferrite forming the second magnetic field shielding layer 210 provided on the second shielding sheet 200 may exhibit magnetic properties such as magnetic permeability and the like of a magnetic field shielding unit described below in a fragmented state, there is no limitation on composition, crystal type, and microstructure of sintered particles. However, preferably, the crystal structure of ferrite may be spinel type. In addition, the ferrite may be preferably a Ni—Zn—Cu ferrite. More preferably, the Ni—Zn—Cu ferrite is a ferrite including 8 to 40 mol % of zinc oxide (ZnO), 7 to 17 mol % of copper oxide (CuO), 37 to 50 mol % of ferric trioxide (Fe2O3), and 11 to 25 mol of nickel oxide (NiO) to exhibit desired physical properties even after being fragmented.

The Ni—Zn—Cu-based ferrite may be a Ni—Zn—Cu—Co ferrite further comprising cobalt tetraoxide ($Co_3O_4$), more preferably 0.2 to 0.35 mol % of cobalt tetraoxide. The addition of cobalt tetroxide may be advantageous in that it is more suitable for short distance communication.

The Ni—Zn—Cu-based ferrite may be a Ni—Zn—Cu—Mg ferrite further containing magnesium oxide (MgO), more preferably 3 to 12 mol % of the magnesium oxide. By further including magnesium oxide, it may be advantageous to exhibit properties more suitable for magnetic security transmission.

On the other hand, the composition and the composition ratio of the ferrite are not limited to these and may be changed according to the desired properties.

The thickness of the second shielding layer 210 may be a thickness of the ferrite sheet derived from the fragments of ferrite and may be 30 μm to 600 μm. If the average thickness is less than 30 μm, the magnetic properties may not be obtained to the desired level. If the average thickness is more than 600 μm, it may be hard to get the slimness of shielding unit.

In addition, the second magnetic field shielding layer 210 may be formed in a shape a polygon such as a pentagon, a circle, an ellipse, or a shape in which a curve and a line are partially mixed, as well as a tetragon such as a rectangle or a square. At this time, the size of the second magnetic field shielding layer may be preferably about 0.1 mm to 2 mm larger than the antenna size of the corresponding module.

Meanwhile, the second shielding sheet 200 included in the embodiment of the present disclosure has a real part ($\mu'$) of the complex permeability at a frequency of 13.56 MHz although the ferrite is included in the fragment state from the beginning to form the second magnetic field shielding layer. The second shielding sheet 200 may satisfy 95 or more, preferably 125 or more, more preferably 140 or more, and even more preferably 180 or more. Although this greatly improves the flexibility of the second shielding sheet 200 through the fragmentation of ferrite, the physical properties required by the desired short distance communication may be fully satisfied, and even if there is an additional breakage of the ferrite fragments that may occur, it is possible to satisfy the property values required by the intended short distance communication in consideration of the deterioration of physical properties.

If the real part of the complex permeability at the above frequency is less than 95, the desired level of short distance communication efficiency may not be achieved. If the ferrite fragments may be further finely fragmented, it is impossible to satisfy the required level of physical property. There may be a problem causing defects. In order to improve the short distance communication efficiency and communication distance, the second shielding sheet 200 may have a quality index value of 20 or more, more preferably 45 or more, at a frequency of 13.56 MHz according to following Equation 2.

$$\text{A quality index value} = \text{a real part of complex permeability at a predetermined frequency } (\mu) \div \text{an imaginary part of complex permeability at a predetermined frequency } (\mu'') \qquad [\text{Equation 2}]$$

The increasing of the quality index value means that the real part of the complex permeability is increased and the imaginary pat of the complex permeability is no change. Alternatively, the real part of the complex permeability is constant and the imaginary part of the complex permeability may be decreased. Alternatively, the real part of the complex permeability is increased and the imaginary part of the complex permeability is decreased at the same time. In any case, the short distance communication efficiency and communication distance can be increased. If the quality index value is less than 20 at a frequency of 13.56 MHz, the short distance communication efficiency may not be achieved at the desired level, and the magnetic loss and heat generation due to the eddy current loss in the magnetic loss may increase.

On the other hand, the magnetic fragments of the first shielding sheets 100, 101, 102, 103 and 104 and the second shielding sheets 200, 201, 202 and 203, and the magnetic permeability per frequency may be different from each other. Accordingly, the particle size distribution for expressing a certain level of flexibility may vary depending on the kind of the magnetic material. The degree of the magnetic property which is deteriorated due to the additional fine fragmentation may also be different. The magnetic field shielding unit according to the present disclosure improves the characteristics of each antenna in which different frequency bands are set as the operating frequency in consideration of the degree of change in magnetic characteristics expressed by mechanical strength and fragmentation degree of each magnetic material. In order to improve the flexibility of the shielding unit, the value of Equation 1 according to the present disclosure may be 3 to 35, preferably 3 to 25, and more preferably 3.3 to 23.1.

$$\text{The average diameter of the fragments of ferrite } (\mu m)/\text{the average diameter of fragment of Fe-based alloy } (\mu m) \qquad [\text{Equation 1}]$$

If the value of Equation 1 is less than 3, the magnetic characteristics of the second shielding sheet may not be very good and the short distance communication efficiency and the transmission/reception distance may not be achieved to the desired level. The flexibility of the first shielding sheet is poor, which makes it difficult to maintain additional magnetic micro-fragmentation and magnetic characteristics designed initially. Magnetic loss due to eddy currents or the like in the first shielding sheet is remarkable and the wireless charging efficiency and the transmission/reception distance may not be attained to a desired level. Also, if the value of Equation 1 exceeds 35, the flexibility of the second shielding sheet may not be very good and it is not possible to maintain the additional micro-fragmentation and hence the magnetic characteristics designed initially. The magnetic characteristics of the first shielding sheet may not be good and the wireless power transmission efficiency, the transmission/reception distance and the like may not be attained to an intended level.

Figure 4:
FIG. 4 is a view schematically showing the shape of fragments observed on one surface of the magnetic field shielding layer in the magnetic field shielding unit according to an embodiment of the present disclosure.

Also, in the Fe-based amorphous alloy, the range of Equation 1 according to the present disclosure for the further enhancement of the wireless power transmission effect according to the composition may be different. Specifically, when the Fe-based amorphous alloy is a three-element-based alloy containing iron (Fe), silicon (Si) and boron (B), the value of the equation 1 according to the present disclosure may preferably be 3.3 to 15. In the case where the Fe-based amorphous alloy is a five-element-based alloy containing iron (Fe), silicon (Si), boron (B), copper (Cu) and niobium (Nb), the value of equation 1 may be between 5 and 23.1. When the above range is satisfied, the wireless power transmission efficiency and/or the short distance communication efficiency may be further improved On the other hand, the magnetic fragments contained in the first shielding sheets 100, 101, 102, 103 and 104 and the second shielding sheets 200, 201, 202 and 203, specifically the fragments of the Fe-based fragments have a curved shape, at least one of which is not a straight line, as shown in FIG. 4. Further, if the magnetic field shielding layer includes the fragments of ferrite of which one side is curved, collision or friction between adjacent fragments may be reduced when the magnetic field shielding unit is bent. There is an advantage that additional fine fragmentation may be prevented even when an external force is applied to the magnetic field shielding unit.

Preferably, the number of the fragments of the Fe-based alloy having a curved shape, at least one of which is not a straight line, may be 15% to 90% of the total number of fragments of the Fe-based alloy in the magnetic field shielding unit. If the number of fragments having at least one curved shape is less than 15% of the total number of fragments, flexibility may not be improved. In addition, fine fragments may be generated due to an external impact, which may result in deterioration of properties such as reduction of permeability of the magnetic field shielding unit. If the number of fragments of an Fe-based alloy having at least one curved shape exceeds 90% of the total number of fragments, the number of fragments having a curved shape may increase and flexibility may be improved. However, since the particle size may be excessively small, the desired effect may not be achieved.

Preferably, the number of the fragments of the ferrite having a curved shape, at least one of which is not a straight line, may be 25% to 90% of the total number of fragments of the ferrite in the magnetic field shielding unit. If the number of fragments having at least one curved shape is less than 25% of the total number of fragments, flexibility may not be improved. In addition, fine fragments may be generated due to an external impact, which may result in deterioration of properties such as reduction of permeability of the magnetic field shielding unit. If the number of fragments of the ferrite having at least one curved shape exceeds 90% of the total number of fragments, the number of fragments having a curved shape may increase and flexibility may be improved. However, since the particle size may be excessively small, the desired effect may not be achieved.

In order to prevent further breakage and fragmentation of the fragments of ferrite, the fragments of ferrite 210a included in the second shielding sheet 200 may preferably include 10% or more fragments having a shape ratio of 8.0 or less on one side of the fragments according to the following equation 3.

Shape ratio=Diameter of circumscribed circle of a fragment (μm)/Diameter of inscribed circle of a fragment (μm)     [Equation 3]

Figure 5A:
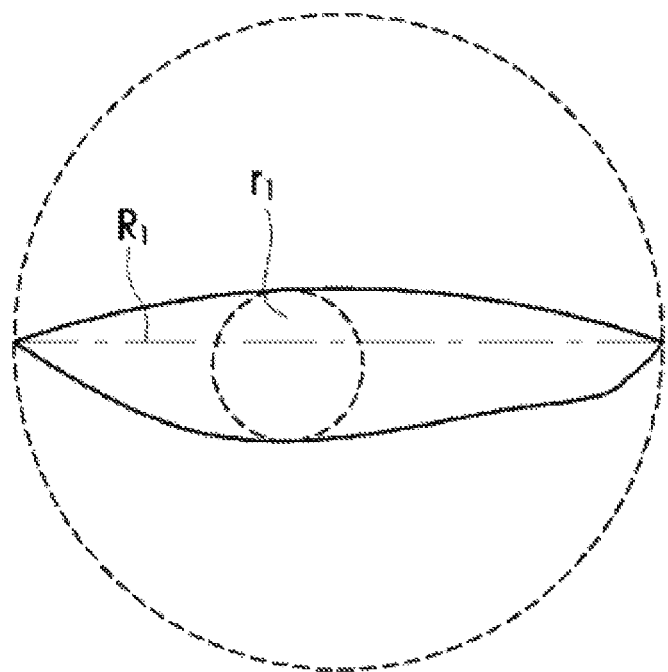
FIGS. 5A and 5B are diagrams showing a diameter of circumscribed circle and a diameter of inscribed circle of the fragments for evaluating a shape ratio of ferrite fragments having shape of irregular shapes.
Figure 5B:
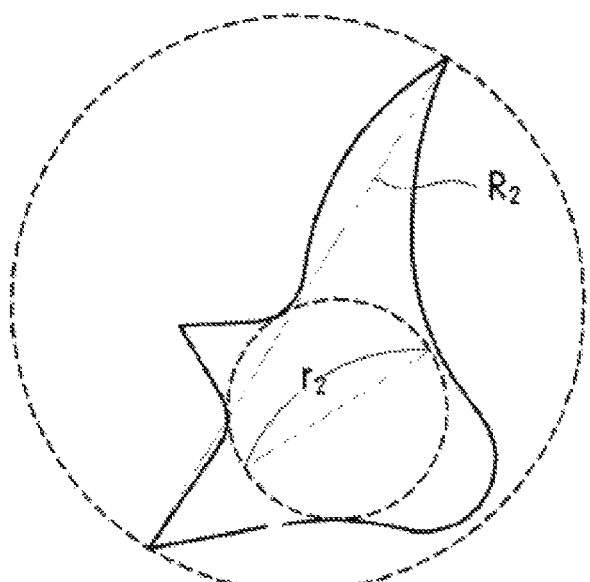

In Equation 3, the diameter of circumscribed circle of the fragment may mean the longest distance between any two points on one side of the fragment (R1 in FIG. 5A and R2 in FIG. 5B), and a circle passing through two points of the fragment farthest from each other is the circumscribed circle of the fragment. The diameter of the inscribed circle of the fragment may mean the diameter of the inscribed circle having the largest diameter among the inscribed circles in contact with at least two sides present on any one side of the fragment (r1 in FIG. 5A, r2 in FIG. 5B). The large shape rate of one side of the fragments means that the shape of the one side of the fragments is long (refer to FIG. 5A) or sharp (refer to FIG. 5B). This means that additional breakage, and fragmentation the fragments may occur.

Accordingly, it is preferable that the number of the fragments having a large shape ratio among the fragments of ferrite included in the second shielding sheet 200 is less than a predetermined ratio. Accordingly, among all the fragments in the second magnetic field shielding layer 210 the fragments having the shape ratio of 8.0 or less according to Equation 3 may be included 10% or more, more preferably 15% or more, further preferably 20% or more. If the fragments having the shape ratio of 8.0 or more are less than 10%, the additional micro-fragmentation of the fragments of ferrite may occur. Thus, when a significant deterioration of physical properties such as permeability may be caused, and the desired initial designed values of physical property may not be maintained.

On the other hand, it is more preferable that the ferrite fragments satisfy the above-described Equation 3 in comparison with the Fe-based alloy fragments because the degree of the magnetic property deterioration due to micro fragmentation of the ferrite fragments is more severe than that of the Fe-based alloy. Thereby the prevention of further micro-fragmentation of the ferrite fragments in the second shielding sheet 200 may need to satisfy the initial design properties.

On the other hand, it is possible to manufacture fragments having a specific shape ratio by suitably adjusting the specifications of the metal balls and/or unevenness of the apparatus for shredding the Fe-based alloy sheet and/or the ferrite sheet.

Meanwhile, as shown in FIG. 1A, when the first magnetic-shielding layer 110 is one, the first shielding sheet 104 may further include a first adhesive layer 140b and a second adhesive layer 130b on the upper and lower portions thereof, respectively. As shown in FIG. 3, when a plurality of the first magnetic field shielding layers 114A, 114B, and 114C are provided, the first adhesive layer 144b and the second adhesive layer 134b may be further formed on the upper portion of the uppermost magnetic shielding layer 114A and the lower portion of the lowermost magnetic shielding layer 114C, respectively. The second shielding sheet 204 may further include a first adhesive layer 240b and a second adhesive layer 230b on upper and lower portions of the second magnetic field shielding layer 210, respectively.

The first adhesive layers 140b, 144b and 240b and the second adhesive layers 130b and 134b and 230b may role that the first shielding sheets 100 and 104 and second shielding sheet 200 may be adhered to the protective members 310 and 320 provided at the top and bottom of the first shielding sheet 100 and 104 and the second shielding sheet 200, respectively. In addition, it is possible to prevent the fragmented Fe-based alloy and the fragmented ferrite from being separated and scattered and prevent the external moisture from penetrating, thereby preventing the alloy or ferrite from being oxidized.

Meanwhile, the first adhesive layers 140b, 144b and 240b and the second adhesive layers 130b, 134b and 230b may be made of the dielectric material 110b penetrating into the gaps between the Fe alloy fragments 110a. That is, after the first adhesive layers 140b, 144b, 240b and the second adhesive layers 130b, 134b, 230b are formed on both surfaces of the sheet-like or plate-like Fe-based amorphous alloy and ferrite, the first adhesive layers 140b, 144b, and 240b and the second adhesive layers 130b, 134b, and 230b may penetrate into the gaps of the fragmented Fe-based alloy fragments. The dielectric 110b may be formed in a part of gaps of the magnetic body fragments without separately providing the dielectric body 110b.

The first adhesive layers 140b, 144b, and 240b and the second adhesive layers 130b, 134b, and 230b may be used without limitation in the case of a normal adhesive layer. Preferably, it may be formed of the above-described dielectric layer forming composition. The compatibility of the first magnetic-shielding layer 110 and the second magnetic-shielding layer 210 may be increased, so that a more improved adhesion may be exhibited. The thicknesses of the first adhesive layers 140b, 144b, and 240b and the second adhesive layers 130b, 134b, and 230b may, respectively, be 1 μm to 50 μm, but are not limited thereto. The first adhesive layers 140b, 144b, 240b and the second adhesive layers

130b, 134b, 230b may be a double-sided tape having adhesive layers formed on both sides of a supporting member, or formed of an adhesive layer without supporting members. The first adhesive layers 140b, 144b and 240b and the second adhesive layers 130b, 134b and 230b may have an adhesive force of 800 to 1500 g·f/inch, but the present disclosure is not limited thereto.

First, the protective member 310 and 320 may be the protective film typically provided in the magnetic field shielding unit. The protective member 310 and 320 needs to have heat resistance sufficient to withstand the heat/pressure applied for hardening in the step of attaching the magnetic field shielding sheet to a substrate having the radiator. In addition, the protective member 310 and 320 also needs to have mechanical strength and chemical resistance sufficient to protect the magnetic field shielding unit against external physical and chemical stimuli. Any film which can meet such characteristics may be used without limitation. As non-limiting examples, the raw material of the protective member 310 and 320 may include polyethylene, polypropylene, polyimide, crosslinked polypropylene, nylon, polyurethane resin, acetate, polybenzimidazole, polyimideamide, polyetherimide, polyphenylene sulfide (PPS), polyethylene terephthalate (PET), polytrimethylene terephthalate (PTT), polybutylene terephthalate (PBT), polyvinylidene fluoride (PVDF), polytetrafluoroethylene (PTFE), polychlorotrifluoroethylene (PCTFE), and polyethylene tetrafluoroethylene (ETFE) and the like, which may be used alone or in combination. The protective member 310 and 320 may have a thickness of 1 μm to 100 μm, preferably 10 μm to 30 μm, but is not limited thereto.

The magnetic field shielding units 400, 401, 402, and 403 according to an embodiment of the present disclosure may be manufactured through a manufacturing method described below, but the present disclosure is not limited thereto.

First, a preferred manufacturing example according to the present disclosure may include a method (method 1) of producing the first shielding sheet and the second shielding sheet before shredding in the shape of FIG. 1 and a method (method 2) of producing the first shielding sheet and the second shielding sheet which are manufactured through shredding process in the shape of FIG. 1.

The manufacturing method described later will be described on the basis of the method 2. As the person skilled in the art can easily carry out the method 1 through the method 2 to be described later, the description of the method 1 is omitted.

First, with the step (1) according to the method 2, the first shielding sheet and the second shielding sheet are respectively produced.

The first shielding sheet 100 and 104 may be manufactured by including (a-1) step for the first shielding sheet before shredding formed of the first adhesive layers 140b and 144b and the second adhesive layers 130b and 134b formed on the upper and lower portions of the Fe-based amorphous ribbon laminate in which one sheet of an Fe-based amorphous ribbon sheet or a plurality of sheets is laminated, and (b-1) step for shredding the first shielding sheet before shredding.

In the step (a-1), the Fe-based amorphous ribbon sheet may be produced by a known method such as rapid coagulation (RSP) by melt spinning. The prepared Fe-based amorphous alloy ribbon may be cut into a sheet and then subjected to a heat treatment process to control the permeability. The heat treatment temperature may be selected depending on the degree of permeability of the desired amorphous alloy. It can exhibit excellent physical properties over a range of operating frequency ranges and can be heat-treated at a temperature of 300 to 600° C. for 30 minutes to 2 hours under an atmosphere or nitrogen atmosphere to increase the brittleness of the amorphous ribbon.

A plurality of Fe-based amorphous ribbon sheets may be laminated according to one purpose or purpose. When a plurality of ribbon sheets is laminated, the above-described dielectric layer forming composition may be applied between the respective ribbon sheets by a conventional method and dried to form the dielectric layers 150a and 150b. Then the first adhesive layer and the second adhesive layer are formed on the upper and lower portions of the ribbon sheet or the plurality of ribbon stacks, respectively. At this time, the first adhesive layer and the second adhesive layer may be formed by applying a conventional adhesive agent or the above-mentioned dielectric forming composition and drying it. At this time, a protective member or a release member may be further provided on the first adhesive layer, and a release member may be further provided on the bottom of the second adhesive layer. The protective member or release member may not be particularly limited in the present disclosure as it can use a member known in the art. The protective member or the release member may serve to protect the first adhesive layer and the second adhesive layer while preventing the amorphous alloy from scattering or escaping in the shredding step of step (b) described later. When a protective member is provided on the first adhesive layer, the protective member may be continuously provided between the upper protective member 320 and the first adhesive layer 140b of the magnetic shielding unit to be manufactured. At this time, a separate adhesive layer may be further provided between the upper protective member 320 and the protective member. Alternatively, the magnetic field shielding unit in which the upper protective member 320 may be omitted when the protective member is provided in the final magnetic field shielding unit.

Next, in the step (b-1), a step of shredding the produced first shielding sheet before shredding may be performed. In one embodiment of the step (b-1), the first shielding sheet before shredding may be passed through a shredding device as shown in FIGS. 6B and 6C, and the Fe-based alloy sheet or plate provided on the first shielding sheet before shredding may be shredding into amorphous fragments. The pressure applied in the shredding step and/or the pressure applied to the first shielding sheet 100 are separately applied to permeate the adhesive layer formed on both sides of the ribbon sheet or the ribbon laminate into the gap of the fragmented Fe-based alloy to form a dielectric. This allows the fragments to be fixed and supported while isolating the fragments, minimizing magnetic losses due to eddy currents. The fragments may be buffered to prevent further fragment damage, shredding, and micro-fragmentation due to external force, thereby preventing permeation of moisture and preventing the magnetic material from being oxidized. On the other hand, the pressing process may be further performed several times to further increase the degree of penetration of the adhesive layer in the gaps between the shredded Fe-based alloys.

Specifically, as shown in FIGS. 6B and 6C, a plurality of insertion recesses 22 into which a plurality of balls 30 are rotatably inserted are provided in the shredding device including a plurality of forming tables 20 and the first shielding sheet 100 before shredding may be manufactured by putting one sheet into the ball 30 and shredding the sheet through the ball 30. Thus, in the flake processing device according to the present embodiment, since the balls 30 are arranged in a plurality of rows, the amorphous ribbons are first shredded while passing through the first-row balls 30*a* and are secondarily shredded while passing through the second-row balls 30*b*. The amorphous ribbons are thirdly shredded while passing through the third-row ball 30*c* and are fourthly shredded while passing through the fourth-row ball 30*d*. Since the flake treatment of the amorphous ribbon is completed in one step, the working time can be shortened and the productivity can be improved.

The pressing unit 40 may include a pressing roller 42 disposed on the top surface of the ball 30 in the same number as the rows of the balls 30 and pressing the amorphous ribbon, a hinge bracket (not shown) rotatably supported at both ends of the pressure roller 42 and arranged linearly in a vertical direction on a first bank (not shown) and a second bank (not shown), a drive motor (not shown) fixed to a base frame (not shown) and a power transmission unit (not shown) for transmitting the rotational force of a drive motor (not shown) to a plurality of pressure rollers 42.

The shape of the ball 30 may be spherical but is not limited thereto. The shape of the ball 30 may be a triangle, a polygon, an ellipse, or the like, and the ball may have one shape or a mixture of various shapes.

Next, the second shielding sheet 200 may be manufactured by a method including the step (a-2) of forming the first adhesive layer 240*b* and the second adhesive layer 230*b* on the upper and lower portions of the ferrite sheet or the plate, respectively, to manufacture the second shielding sheet 200*a* before shredding and the step (b-2) of shredding the second shielding sheet 200*a* before shredding.

First, the step (a-2) of preparing a ferrite sheet or plate may be performed. Since the ferrite sheet or plate may be produced by a conventional method producing the ferrite sheet, the present disclosure is not limited thereto. As an example of the manufacturing method for Ni—Zn—Cu—Co ferrite, nickel oxide, zinc oxide, copper oxide, cobalt oxide, and iron trioxide may be mixed in a predetermined composition ratio to obtain a raw material mixture. At this time, the mixture may be mixed by dry mixing or wet mixing, and the particle diameter of the raw material to be mixed may be preferably 0.05 µm to 5 µm. The components such as nickel oxide, and zinc oxide contained in the raw material mixture may be in the form of a complex oxide containing the above components or the cobalt oxide may be included in the raw material in the form of cobalt ferrite and cobalt trioxide. Next, the raw material mixture is subjected to plasticity to obtain a plastic material. The plasticity may be carried out in order to promote a paralysis of raw material, a homogenization of components, a generation of ferrite, a disappearance of ultrafine powder by sintering, and grain growth to an appropriate degree of particle size, thereby converting the raw material mixture into suitable form for post-processing. The sintering may be preferably carried out at a temperature of 800° C. to 1100° C. for 1 to 3 hours. The preliminary plasticity may be performed in an air atmosphere or an atmosphere having a higher oxygen partial pressure instead the air atmosphere. Next, the obtained sintered material is grinded to obtain a grinded material. The grinding may be carried out to break lumps of the sintered material to obtain a powder having an appropriate degree of sintering property. When the sintered material is large lumps, a wet grinding using a boll mill, an attritor mill or the like may be carried out after the rough grinding. The wet grinding may be carried out until the average particle diameter of the grinded material becomes preferably about 0.5 µm to 2 µm. Thereafter, the ferrite sheet may be produced through the obtained grinding material. A known method may be used for producing the ferrite sheet, which is not particularly limited in the present disclosure. As a non-limiting example, the obtained grinding material may be subject to a slurring processing together with additive agents such as a solvent, a binder, a dispersant, and a plasticizer to produce a paste. Using this paste, a ferrite sheet having a thickness of 30 µm to 350 µm may be formed. After the ferrite sheet is processed into a predetermined shape, the ferrite sheet may be produced though a binder removal process and a plastic process. The sintering process may be carried out preferably at a temperature of 900° C. to 1300° C. for 2 to 5 hours. The sintering process may be performed in an air atmosphere or an atmosphere having a higher oxygen partial pressure than the air atmosphere. On the other hand, as another embodiment for producing the ferrite sheet, the ferrite powder and the binder resin may be mixed and then manufactured by a known method such as a powder compression molding method, an injection molding method, a calendar method and an extrusion method, etc.

The first adhesive layer 240*b* and the second adhesive layer 230*b* are formed on the upper and lower surfaces of the prepared ferrite sheet or plate. The first adhesive layer 240*b* and the second adhesive layer 230*b* are the same as those in the step (a-1) of the first shielding sheet manufacturing method described above, and a detailed description thereof will be omitted.

Next, as the step (b-2), a step of shredding the produced second shielding sheet before shredding may be performed. In one embodiment of the step (b-2), the second shielding sheet 200*a* before shredding may be passed through the shredding device, and the ferrite sheet provided in the second shielding sheet 200*a* before shredding may be divided into ferrite fragments. On the other hand, the conditions of the shredding step may be changed to increase the number of ferrite fragments having a curved shape.

Figure 6A:
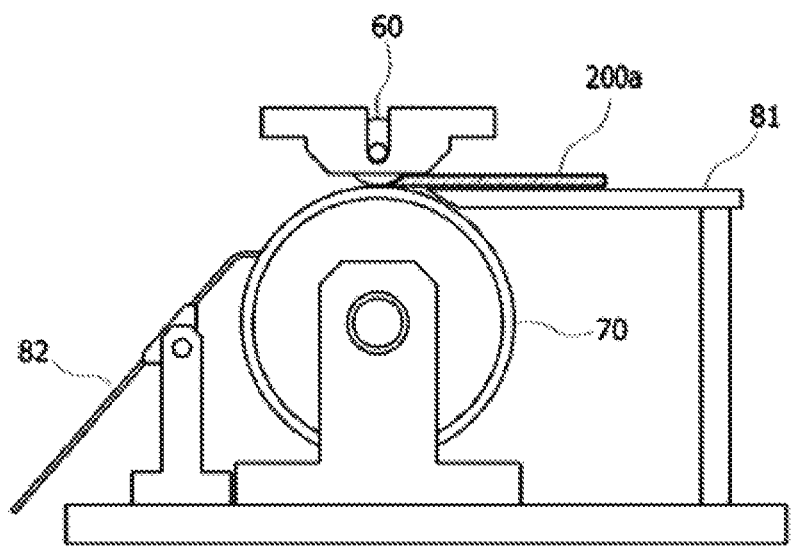
FIG. 6A, FIGS. 6B and 6C are schematic views illustrating a manufacturing process using a shredding device for manufacturing the magnetic field shielding unit according to an embodiment of the present disclosure. In detail.
Figure 6B:
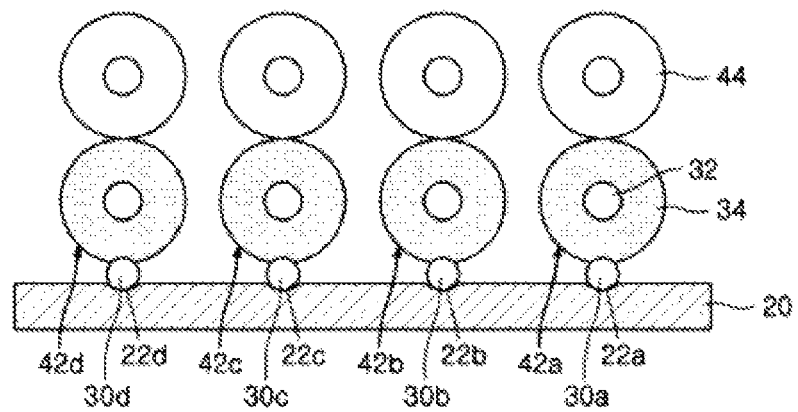
Figure 6C:
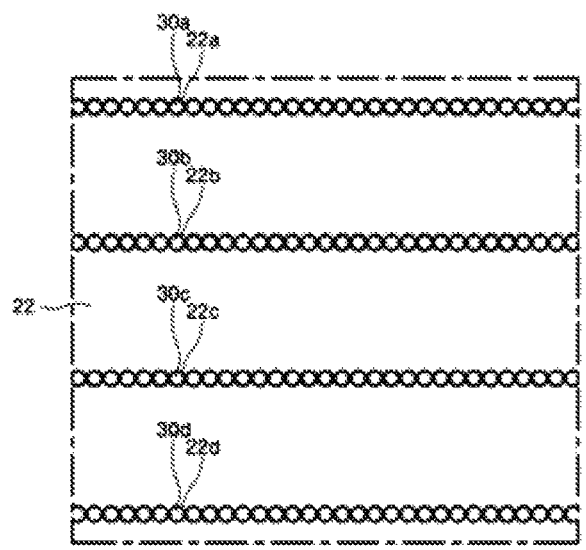

As shown in FIG. 6A, the shredding device may pass the second shielding sheet 200*a* before shredding to the inlet 81 of the shredding device having the first roller 70 and the second roller 60 corresponding to the first roller 70. The second shielding sheet 200 may be produced by shredding and pressing the second shielding sheet 200*a* before shredding to discharge the same through the discharge portion 80. The first roller 70 may be a silicon roller, and the second roller 60 may be a metal roller, but not limited thereto, and any roller that may be used for shredding a ferrite sheet can be used without limitation. Meanwhile, the diameter of the second roller 60 may be adjusted or the intensity of the applied pressure may be adjusted to further increase the number of the fragments having the curved shape.

Then, with the preferred step (2) of manufacturing the magnetic field shielding unit, the step of forming the receiving portion in the manufactured second shielding sheet 200 may be performed. When the receiving portion is a through-type, the through-type receiving portion may be formed by tapping the inside of the second shielding sheet 200 with a desired size. Alternatively, when the receiving portion is the receiving recess, the second shielding sheet 201 or 202 may be recessed to a predetermined depth to form the receiving recess. The method of recessing a certain portion of the second shielding sheet is not particularly limited to this.

Next, as a preferred step (3) of manufacturing the magnetic shielding unit, the first shielding sheet 100, 101 or 102 may be cut so that the second shielding sheet 200, 201 or 202 having the receiving portion may be matched with the size of the receiving portion. Then, the first shielding sheet 100, 101, 102 may be inserted into the receiving portion of the second shielding sheet 200, 201 or 202 to manufacture the magnetic field shielding unit. At this time, the first shielding sheet 100 and the second shielding sheet 200 may be supported by attaching the second adhesive layers 130b and 230b of the first shielding sheet 100 and the second shielding sheet 200 to the lower protective member 320. The first shielding sheets 101 and 102 are formed on the bottom of the receiving recesses of the second shielding sheets 201 and 202 through the second adhesive layer 130b provided on the first shielding sheets 101 and 102. The lower protective member 320 may be further disposed on the lower surface of the second adhesive layer provided on the second shielding sheets 201 and 202. Alternatively, the second adhesive layer provided on the second shielding sheets 201 and 202 may be used as an adhesive layer for attaching to the antenna unit without forming the lower protective member 320. The upper protective member 310 may further be disposed on the first adhesive layers 140b and 240b of the first shielding sheets 100, 101 and 102 and the second shielding sheets 200, 201 and 202.

Figure 7A:
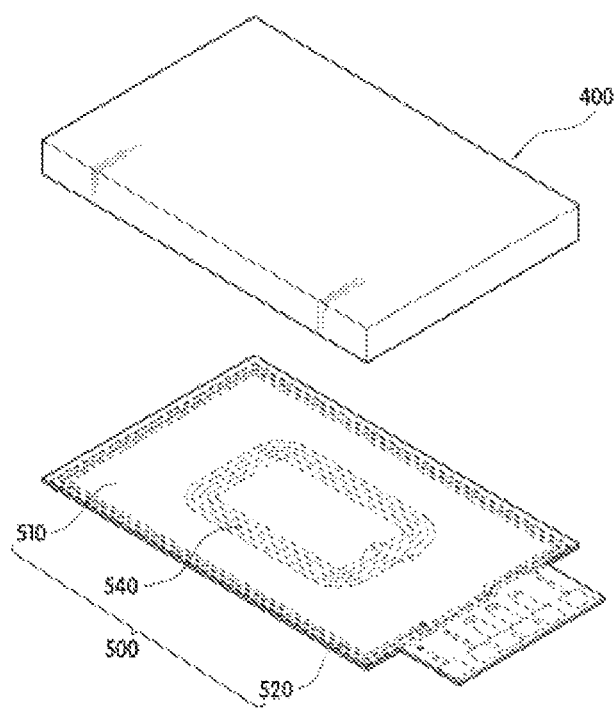
FIG. 7A is an exploded perspective view of the multifunctional integrated module.

As shown in FIG. 7A, the magnetic-field-shielding unit 400 according to an embodiment of the present disclosure manufactured through the above-described method may implement a multifunctional integrated module disposed on one side of antenna unit 500 including a short-distance communication antenna 520 and a wireless power transmission 540. The magnetic field shielding unit 400 may enhance the antenna characteristics and condense the magnetic flux toward the antenna unit.

The antenna unit 500 may include a short distance communication antenna 520 formed on the outer side of the substrate 510 and a wireless power transmission antenna 540 disposed on the inner side of the short distance communication antenna 520. The antenna for short-distance communication 520 or the antenna for wireless power transmission 540 may be an antenna coil wound around the coil so as to have a constant inner diameter or may be an antenna pattern printed with an antenna pattern on a substrate, size, material and the like are not particularly limited in the present disclosure.

Figure 7B:
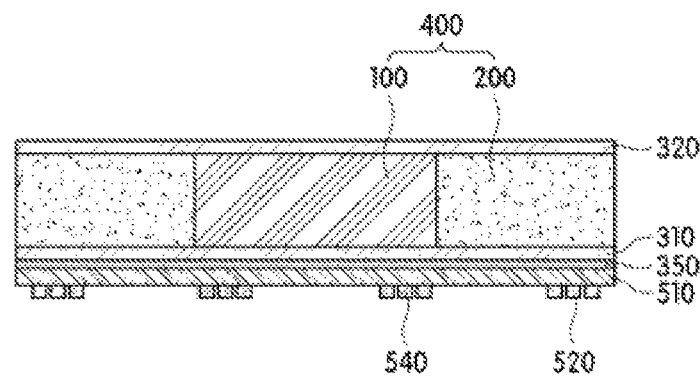
FIG. 7B is a sectional view of the multifunctional integrated module.

When the antennas provided in the antenna unit 500 have the arrangement as shown in FIG. 7A, in order to remarkably express the desired short distance communication and wireless power transmission function, the first shielding sheet 100 and the second shielding sheet 200 may be arranged such that the sheet exhibiting excellent magnetic characteristics at the operating frequency used by corresponding to the corresponding antenna. Accordingly, as shown in FIG. 7B, the first shielding sheet 100 may be received in the second shielding sheet 200 with a width correspond to the wireless power transmission antenna 540.

Specifically, the sheet that exhibits excellent magnetic characteristics at the operating frequency used by the antenna is that the first shielding sheet 100 has a relatively higher permeability than the second shielding sheet 200 in a low frequency band of 10 to 400 kHz and/or has a relatively larger saturation magnetic field than the second shielding sheet 200 in the frequency band of 10-400 kHz. Since the first shielding sheet 100 has a relatively higher magnetic permeability than the second shielding sheet 200 in the frequency band of 10 to 400 kHz, the alternating magnetic field generated according to the power signal of the transmitting frequency of 10 to 400 kHz may be induced to the first shielding sheet having a relatively high magnetic permeability during the wireless power transmission. Therefore, it is possible to induce the wireless power signal to be received with high efficiency by the wireless power transmission antenna disposed on a side of the first shielding sheet 100.

Also, the second shielding sheet 200 may have a high permeability real part and a high imaginary part in the frequency band of 13.56 MHz. Therefore, when the near field communication is performed, the quality factor of the antenna may be increased through the second shielding sheet 200 having a higher permeability real part/imaginary part value in the frequency band of 13.56 MHz generated from the antenna installed in the RF reader. Therefore, it is possible to induce high-frequency signals to be received by the NFC antenna disposed on the second shielding sheet 200 side with high efficiency.

Figure 8:
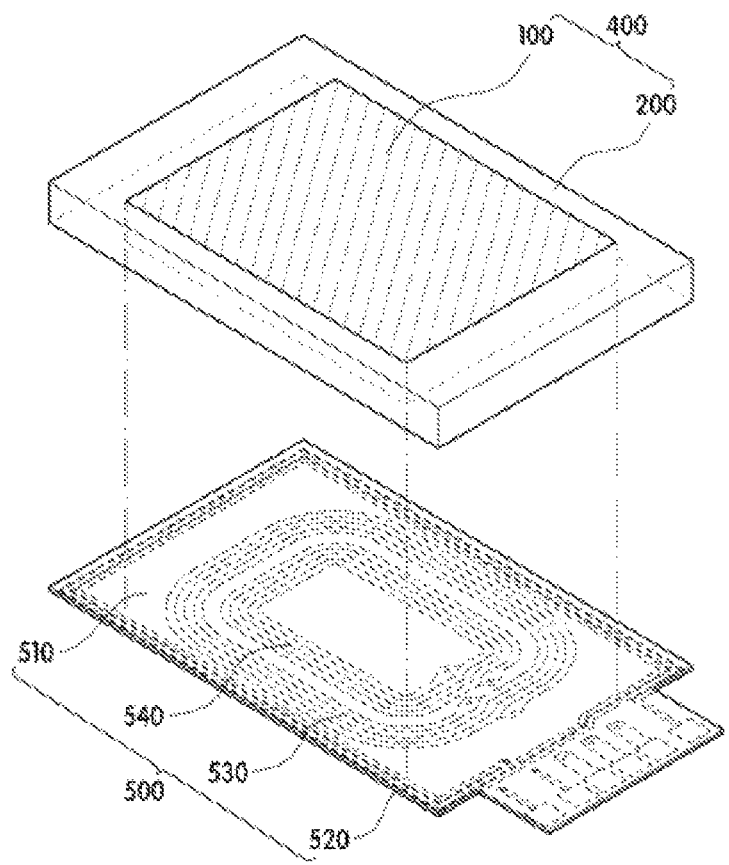
FIG. 8 is an exploded perspective view of the multifunctional integrated module according to another embodiment of the present disclosure.

As shown in FIG. 8, the antenna unit 500 may further include a magnetic security transmission antenna 530. When the operation frequency of the magnetic security transmission antenna 530 is 10 kHz to 400 kHz. The magnetic security transmission antenna 530 may be combined to correspond to the first shielding sheet 100 exhibiting excellent magnetic characteristics in the frequency band.

Also, the multifunctional integrated module according to an embodiment of the present disclosure may be provided in the portable device as the receiving module, and wireless power transmission efficiency, data receiving efficiency, charging distance or data receiving distance can be remarkably improved.

The present disclosure will now be described more specifically with reference to the following examples. However, the following the examples should not be construed as limiting the scope of the present disclosure and should be construed to facilitate understanding of the present disclosure.

Example 1

(1) Manufacturing the First Shielding Sheet

1) Manufacturing the First Magnetic Field Shielding Layer

After manufacturing a Fe73.5Si13.5B9Cu1Nb3 amorphous alloy ribbon by the rapid solidification process (RSP) through melt spinning, a ribbon sheet having a thickness of 24 μm cut into a sheet shape was heat-treated without magnetic field at 560° C., in an N2 atmosphere for 1 hour. A PET protective member (International Latex, KJ-0714) having a thickness of 7 an and an adhesive layer formed thereon was attached to one surface of the ribbon sheet, and then the shredding device as shown in FIGS. 6B and 6C was passed three times to form the first magnetic field shielding layer. The metal balls were in the shape of a sphere having a diameter of 3 mm and a shredding device having a distance between metal balls of 0.5 mm was used.

2) Manufacturing the First Shielding Sheet

The first magnetic field shielding layer was laminated in a three-layer structure as shown in FIG. 3 to prepare the first shielding sheet. Thereafter, the first shielding sheet was cut into 45 mm×48 mm.

(2) Manufacturing the Second Shielding Sheet 5 parts by weight of a polyvinyl butyral resin with respect to 100 parts by weight of a ferrite powder having an average particle diameter of 0.75 μm (48.75 mol % of Fe2O3, 14.79 mol % of NiO, 24.99 mol % of ZnO, 11.22 mol % of CuO and 0.25 mol % of Co3O4) 50 parts by weight of a solvent in which toluene and ethanol were mixed in a ratio of 5:5 were mixed, dissolved and dispersed in a ball mill. Thereafter, the ferrite mixture was formed into a sheet shape by a conventional tape casting method, followed by degreasing at 500° C. for 10 hours, followed by firing and cooling at 940° C. for 2.2 hours to prepare a ferrite sheet having a final thickness of 80 μm.

Thereafter, the double-sided tape (support base PET, KYWON CORP., VT-8210C) having a thickness of 10 μm and the release film adhered to one surface of the ferrite sheet was attached. PET protective (International Latex, KJ-0714) was attached, and then passed through a shredder as shown in FIG. 6A to prepare the second shielding sheet. A silicone roller having a diameter of 100 mm was used as the first roller, and a carbon steel S45C roller having a diameter of 36 mm was used as the second roller.

Thereafter, the second shielding sheet was cut into 75 mm×80 mm, and a 45 mm×48 mm through-type receiving portion was formed by punching the inside of the second shielding sheet to form a through-type receiving portion in the cut second shielding sheet.

(3) Manufacturing the Magnetic Field Shielding Unit

The magnetic field shielding unit was manufactured by providing the first shielding sheet in the cut receiving portion of the second shielding sheet formed with the through-type receiving portion.

Examples 2 to 7 and Comparative Examples 1 to 5

The magnetic field shielding unit was manufactured in the same manner as in Example 1 except that the shredding conditions were changed as shown in Table 1 below.

Example 8

The magnetic field shielding sheet was manufactured in the same manner as in Example of 1, except that the $Fe_{91.6}Si_2B6Co_{0.2}Ni_{0.2}$ amorphous alloy was used in the first magnetic field shielding layer manufacturing step.

Example 9

Same as in Example of 1 except that ferrite powder having an average particle diameter of 0.75 μm (48.5 mol % $Fe_2O_3$, 4.1 mol % NiO, 28.8 mol % ZnO, 10.3 mol % CuO, and 8.2 mol % MgO) to prepare a magnetic field shield sheet.

Experimental Example 1

The following properties of the magnetic field shielding unit according to Examples and Comparative Examples were evaluated and shown in Table 1 below.

1. Measurement of Diameter Size Distribution of Fragments

After separating the first shielding sheet and the second shielding sheet of each of the magnetic fielding shielding units manufactured according to the embodiment, the adhesive protective film provided on one surface of the first shielding sheet and the second shielding sheet was peeled off, and the average diameter size of the Fe-based alloy fragments and the ferrite fragments were measured. The number of fragments less than 500 μm and the total number of fragments were counted and then the fraction of fragments smaller than 500 μm in diameter size relative to the total number of fragments was measured to calculate average fractions of five samples.

2. Wireless Power Signal Transmission Efficiency and Data Signal Transmission Distance Evaluation As shown in FIG. 7A, the short distance communication antenna 520 and the wireless power transmission antenna 540 were implemented using a copper foil having a thickness of 50 μm on both sides of the FPCB 510. Specifically, the short distance communication antenna 520 was formed by turning four turns of a copper foil having a thickness of 50 μm so as to be 53 mm×63 mm in the inside and 59 mm×65 mm in the outside. VSWR (Voltage Standing Wave Ratio)) was 1.5, and the resonance frequency was 13.56 MHz. Unlike FIG. 7A, the copper foil having a thickness of 50 μm was turned by 11 turns to have an inner diameter of 23 mm and an outer diameter of 43 mm. At frequency 200 kHz, the inductance Ls was 8.8 μH, and the resistance (Rs) was 0.589Ω.

The multifunctional integrated module was manufactured by arranging the magnetic field shielding unit on one surface of the antenna unit such that the first shielding sheet of the magnetic field shielding unit corresponds to the wireless power transmission antenna such that the second shielding sheet of the magnetic field shielding unit corresponds to the short distance communication antenna. The following properties were evaluated for each multifunctional integrated module manufactured.

2-1. Wireless Power Signal Transmission Efficiency

A 200 kHz sinusoidal signal was amplified and input to the wireless power transmitting antenna provided in the wireless power signal transmission module, and a integrated module having a load resistance of 50Ω connected to the output terminal of the wireless power receiving antenna was aligned. In this state, the electric power transmission efficiency was measured by measuring the current generated through the wireless power receiving antenna through an oscilloscope. As a result of the measurement, the power transmission efficiencies of the exemplary embodiments were relatively evaluated on the basis that the power transmission efficiency of the comparative example was regarded as 100%.

2-2. Data Signal Transmission Distance

An NFC reader/writer were connected to the NFC antenna of the integrated module through a cable. In addition, an NFC card in which an NFC IC chip and the same antenna as the NFC antenna provided in the integrated module are connected was manufactured. Thereafter, a data signal of 13.56 MHz was output through the NFC reader/writer, and the NFC card was placed in the vertical direction of the NFC antenna of the integrated module, and the maximum communication distance range was measured. As a result of the measurement, the data signal transmission distance ranges of the exemplary embodiments were relatively evaluated on the basis that the maximum communicable distance range of the comparative example was regarded as 100%.

TABLE 1

| Field | Example 1 | Example 2 | Example 3 | Example 4 | Example 5 | Example 6 | Example 7 |
|---|---|---|---|---|---|---|---|
| Number of shredding of ferrite sheet | 1 | 3 | 2 | 1 | 1 | 1 | 1 |
| Number of shredding of Fe-based alloy ribbon | 3 | 3 | 3 | 4 | 5 | 6 | 7 |
| Average diameter of ferrite fragments (μm) | 1810 | 582 | 847 | 1810 | 1810 | 1810 | 1810 |

TABLE 1-continued

| Field | | Example 1 | Example 2 | Example 3 | Example 4 | Example 5 | Example 6 | Example 7 |
|---|---|---|---|---|---|---|---|---|
| Average diameter of Fe-based fragments (μm) | | 138 | 138 | 138 | 96 | 73 | 66 | 53 |
| | Equation 1 | 13.1 | 4.2 | 6.1 | 18.9 | 24.8, | 27.6 | 34.2 |
| Fe-based fragments | Radio of fragments less than 500 μm (%) | 92 | 92 | 99 | 100 | 100 | 100 | 100 |
| Wireless Power Transmission Efficiency (%) | | 146 | 132 | 137 | 139 | 136 | 129 | 127 |
| Data signal transmission distance (%) | | 92 | 83 | 87 | 88 | 83 | 81 | 79 |

TABLE 2

| Field | | Example 8 | Example 9 | Comparative Example 1 | Comparative Example 2 | Comparative Example 3 | Comparative Example 4 | Comparative Example 5 [1)] |
|---|---|---|---|---|---|---|---|---|
| Number of shredding of ferrite sheet | | 1 | 1 | — | 4 | 1 | 1 | 8 |
| Number of shredding of Fe-based alloy ribbon | | 3 | 3 | — | 3 | 8 | 1 | 3 |
| Average diameter of ferrite fragments (μm) | | 1810 | 1566 | — | 349 | 1810 | 1810 | 68 |
| Average diameter of Fe-based fragments (μm) | | 286 | 138 | — | 138 | 48 | 771 | 138 |
| | Equation 1 | 6.32 | 11.3 | — | 2.5 | 37.5 | 2.35 | 0.49 |
| Fe-based fragments | Radio of fragments less than 500 μm (%) | 73 | 92 | — | 92 | 100 | 56 | 92 |
| Wireless Power Transmission Efficiency (%) | | 139 | 142 | 100 | 128 | 122 | 109 | 121 |
| Data signal transmission distance (%) | | 91 | 90 | 100 | 71 | 76 | 80 | 66 |

[1)] The comparative example shows the multifunctional integrated module comprising the unfragmented Fe-based alloy sheet and the ferrite sheet.

As can be seen from Tables 1 and 2, Examples 1 to 9 satisfying the values 3 to 35 of the equation 1 for the average diameter size of the Fe-based alloy fragments the average diameter size of the ferrite fragments are superior to those of Comparative Examples 1 to 5, which do not satisfy this requirement, with respect to the wireless power transmission efficiency and data signal transmission distance.

As can be seen from Example 1, Comparative Examples 4 and Example 5, when either the average diameter range of the ferrite fragments or the average diameter of the Fe-based fragments is unsatisfactory, the effect corresponding to each particle may decrease. It was also found that the effect corresponding to other fragments was reduced. Specifically, since Comparative Example 4 does not satisfy the average diameter of Fe-based fragments, the wireless power transmission efficiency is reduced as additional fragmentation occurs, and at the same time, the data signal transmission distance is also reduced compared to Example 1. Also, in Comparative Example 5, the data signal transmission distance is reduced as the average diameter of the ferrite fragments is excessively small, and the wireless power transmission efficiency is also reduced as compared with the first embodiment. Accordingly, it can be seen that the wireless power transmission efficiency and the data signal transmission distance can be simultaneously improved due to the synergy effect when the diameter sizes of the respective fragments are all satisfied.

Compared with Example 1, in which the number of fragments having a diameter of less than 500 μm was 60% or more, Comparative Example 4 in which the number of fragments having a diameter of the Fe-based alloy of less than 500 μm was less than 60% had poor the wireless power transmission efficiency because the number of fragments indicating the proper diameter size was small. At the same time, the data signal transmission distance also decreased. Accordingly, the wireless power transmission efficiency and the data signal transmission distance can be improved by satisfying the number of the fragments having the diameter of the Fe-based alloy of less than 500 μm of 60% or more.

On the other hand, the multifunctional integrated module according to Example 8 including the Fe-based alloy fragments of the three-element and Example 9 including the ferrite fragments containing magnesium oxide (MgO) are almost the same as those of the multifunctional integrated module in the wireless power transmission efficiency and data signal transmission distance. Therefore, the magnetic-field shielding unit and/or the multifunctional integrated module according to the present disclosure can exhibit excellent effects without being limited to the Fe-based alloys and/or ferrites of Examples 1 to 7.

On the other hand, the multifunctional integrated module manufactured according to the comparative example does not have a synergistic effect with each other because it includes a Fe-based alloy and a ferrite on a sheet. As a result, it can be confirmed that the power transmission efficiency and the data signal transmission distance are relatively poor.

3. Flexibility Evaluation

In order to evaluate the flexibility of the magnetic shielding sheet manufactured according to the examples and the comparative example, the experiment was carried out under the same conditions as the above-mentioned experimental method, except that the antenna unit and the magnetic shielding sheet were separated. The antenna unit was placed on the magnetic shielding sheet to measure the power transmission efficiency and the maximum communication distance. The power transmission efficiency and the maximum communication distance after bending based on the power transmission efficiency before bending and the maximum communication distance as 100% are respectively evaluated and shown in Table 3 below.

TABLE 3

|  |  | Example 1 | Example 3 | Example 4 | Comparative example 1 |
|---|---|---|---|---|---|
| Wireless Power Transmission Efficiency (%) | Before bending | 100 | 100 | 100 | 100 |
|  | After bending | 95 | 98 | 95 | 37 |
| Data signal transmission distance (%) | Before bending | 100 | 100 | 100 | 100 |
|  | After bending | 96 | 97 | 94 | 33 |

As can be seen from Table 3, Example 1, Example 3 and Example 4 including the fragments having the curved shape of the present disclosure exhibited excellent power transmission efficiency and data signal transmission distance even after bending the multifunctional integrated module.

It can be seen that the power transmission efficiency and the data signal transmission distance of the multifunctional integrated module manufactured according to Comparative Example 1 are drastically reduced due to the occurrence of excessive fragmentation at the bending stage.

Examples 10 to 13

The magnetic field shielding unit was manufactured in the same manner as in Example 1 except that the shredding conditions and the composition of each layer were changed as shown in Table 4 below.

Experimental Example 2

The following properties of the magnetic field shielding unit according to Example 1, Examples 10 to 13 and Comparative Example 1 were evaluated in order to measure the effects of the fragments having a curved shape.

1. Measuring the Ratio of Fragments with Curved Shape

After separating the first shielding sheet and the second shielding sheet of each of the magnetic field shielding units manufactured according to Examples 1 and 10 to 13, and the adhesive protective film provided on one surface of the first shielding sheet and the second shielding sheet was peeled off, the number of fragments having a curved shape relative to the total number of fragments was counted by an optical microscope and the ratio thereof was calculated.

2. Wireless Power Signal Transmission Efficiency and Data Signal Transmission Distance Evaluation The short distance communication antenna 520 and the wireless power transmission antenna 540 are implemented using a copper foil having a thickness of 50 μm on both sides of the FPCB 510 as an antenna unit having a shape as shown in FIG. 7A. Specifically, the short distance communication antenna 520 was formed by turning four turns of a copper foil having a thickness of 50 μm so as to be 53 mm×63 mm in the inside and 59 mm×65 mm in the outside, and VSWR (Voltage Standing Wave Ratio) was 1.5, and the resonance frequency was 13.56 MHz. Unlike to FIG. 7A, the wireless power transmission antenna 540 was changed to a circular shape to make a copper foil having a thickness of 50 μm 11 turns to have an inner diameter of 23 mm and an outer diameter of 43 mm and an inductance (Ls) was 8.8 pH, and the resistance (Rs) was 0.589Ω.

The second shielding sheet of the magnetic shielding unit corresponded to the short distance communication antenna of the manufactured antenna unit and the first shielding sheet of the magnetic shielding unit corresponded to the wireless power transmission antenna so that the magnetic field shielding unit was disposed on one surface of the antenna unit to produce a multifunctional integrated module. The following properties were evaluated for each multifunctional integrated module manufactured.

2-1. Wireless Power Signal Transmission Efficiency

A 200 kHz sinusoidal signal was amplified and input to the wireless power transmission antenna provided in the wireless power signal transmission module. Then, the integrated module to which the load resistance of 50Ω was aligned to the output terminal of the wireless power receiving antenna. At this time, the wireless power signal transmission efficiency was measured by measuring the current generated through the wireless power receiving antenna through an oscilloscope.

2-2. Data Signal Transmission Distance

An NFC reader/writer was connected to the short distance communication antenna of the integrated module through a cable. In addition, an NFC IC chip and an NFC card connected to the same antenna as the short distance communication antenna provided in the integrated module were manufactured. After outputting a data signal of 13.56 MHz through the NFC reader/writer, the NFC card was positioned in the vertical direction of the short distance communication antenna of the integrated module. At this time, the maximum communication distance was measured. The experiment was carried out thereafter under the same conditions as the above experimental method. After an operation of bending and stretching for 100 times so that both side edges of the separated magnetic field shielding sheet contacted, the antenna unit was disposed on the magnetic field shield sheet to measure the maximum communicable distance. The maximum communicable distance after bending based on the maximum communicable distance before bending was relatively evaluated.

TABLE 4

|  | Field | Example 1 | Example 10 | Example 11 | Example 12 | Example 13 | Comparative example 1 1) |
|---|---|---|---|---|---|---|---|
| Manufacturing the first shielding sheet | Distance between metal balls (mm) | 0.5 | 0.7 | 0.9 | 1 | 0.6 | — |

TABLE 4-continued

| Field | | Example 1 | Example 10 | Example 11 | Example 12 | Example 13 | Comparative example 1 1) |
|---|---|---|---|---|---|---|---|
| Manufacturing the second shielding sheet | Diameter of the second roller (mm) | 36 | 44 | 56 | 40 | 54 | — |
| Ratio of Fragment of curved shape | Fe-based alloy fragment (%) 2) | 31 | 18 | 12 | 11 | 20 | — |
| | Ferrite fragment (%) 3) | 43 | 26 | 20 | 29 | 21 | — |
| Wireless power transmission efficiency | Before bending | 100 | 100 | 100 | 100 | 100 | 100 |
| | After bending | 98 | 97 | 81 | 80 | 97 | 37 |
| Data signal transmission distance | Before bending | 100 | 100 | 100 | 100 | 100 | 100 |
| | After bending | 97 | 96 | 83 | 96 | 81 | 33 |

1) The comparative example shows the multifunctional integrated module comprising the unfragmented Fe-based alloy sheet and the ferrite sheet.
2) The Fe-based alloy fragments(%) represents the ratio (%) of the number of fragments having the curved shape among the Fe-based alloy fragments to the total number of Fe-based alloy fragments.
3) The ferrite fragments (%) represent the ratio (%) of the number of fragments having the curved shape among the ferrite fragments to the total number of ferrite fragments.

When Examples 1, 10 and 13, in which the number of fragments having a curved shape in the fragments of the Fe-based alloy is 15% or more of the number of fragments of the entire Fe-based alloy, the power transmission efficiency is excellent even after bending the multifunctional integrated module 100 times in comparison with the Examples 11, 12, and Comparative Example 1. When Examples 1, 10 and 12, in which the number of fragments having a curved shape in the ferrite fragments was 25% or more of the total number of ferrite fragments, were compared with those of Examples 11 and 13 and Comparative Example 1, the data signal transmission distance is excellent even after bending the multifunction composite module 100 times.

Accordingly, when the ratio of the fragments having a curved shape does not satisfy the above condition, in the course of bending the multifunctional integrated module, the fragments of ferrite and/or fragments of the Fe-based alloys are further fragmented, and efficiency and/or data signal transmission distance is reduced.

As described above, the present disclosure has been described with respect to particularly preferred embodiments. However, the present disclosure is not limited to the above embodiments, and it is possible for one who has an ordinary skill in the art to make various modifications and variations, without departing off the spirit of the present disclosure.

What is claimed is:

1. A magnetic field shielding unit comprising:
   a first shielding sheet, for improving characteristics of a wireless power transmission antenna, including a first magnetic field shielding layer formed of fragments of shredded Fe-based alloy to improve a flexibility of the shielding unit and to reduce generation of eddy currents; and
   a second shielding sheet, for improving characteristics of a short distance communication antenna, including a second magnetic field shielding layer formed of fragments of shredded ferrite to improve the flexibility of the shielding unit and a receiving portion to receive a partial or an entire thickness of the first shielding sheet;
   wherein a value according to following Equation 1 for an average diameter of fragments of Fe-based alloy and an average diameter of fragments of ferrite is 3 to 35:

Average diameter of fragments of ferrite (μm)/Average diameter of fragments of Fe-based alloy (μm).

2. The magnetic field shielding unit of claim 1, wherein the receiving portion is a receiving recess recessed from a surface of the second shielding sheet to a predetermined depth, or a through hole penetrating the second shielding sheet.

3. The magnetic field shielding unit of claim 1, wherein the first magnetic field shielding layer includes a dielectric filling at least a part of gaps between adjacent Fe-based alloy fragments.

4. The magnetic field shielding unit of claim 1, wherein the first shielding sheet unit includes a first magnetic field shielding layers, and a dielectric layer is interposed between adjacent the first magnetic field shielding layers to adhere the magnetic field shielding layers to each other.

5. The magnetic field shielding unit of claim 1, wherein fragments of Fe-based alloy have an average diameter of 0.5 μm to 700 μm.

6. The magnetic field shielding unit of claim 1, wherein the number of Fe-based alloy fragments of which diameters are less than 500 μm is 60% or more of the total number of Fe-based alloy fragments.

7. The magnetic field shielding unit of claim 1, wherein the first magnetic field shielding layer has a thickness of 15 μm to 50 μm.

8. The magnetic field shielding unit of claim 4, wherein the first shielding sheet includes 2 to 12 of the first magnetic field shield layers.

9. The magnetic field shielding unit of claim 1, wherein the second shielding sheet has a quality index value of 20 or more at an operating frequency of 13.56 MHz according to following Equation 2:

A quality index value=a real part of complex permeability at a predetermined frequency (μ')÷an imaginary part of complex permeability at a predetermined frequency (μ").

10. The magnetic field shielding unit of claim 1, wherein the second magnetic field shielding layer has a thickness of 30 μm to 600 μm.

11. The magnetic field shielding unit of claim 1, wherein the average diameter of a single fragment of the ferrite fragments is 100 μm to 2100 μm.

12. The magnetic field shielding unit of claim 1, wherein the value according to the Equation 1 is 3 to 25.

13. A multifunctional integrated module comprising;
an antenna unit including a short distance communication antenna and a wireless power transmission antenna; and
a magnetic field shielding unit of claim 1, which is disposed on one side of the antenna unit to improve antenna characteristics and condense a magnetic flux toward the antenna unit.

14. The multifunctional integrated module of claim 13, wherein the wireless power transmission antenna is formed inside the short distance communication antenna, and the first shielding sheet of the magnetic field shielding unit corresponds to the wireless power transmission antenna.

15. The multifunctional integrated module of claim 13, wherein the antenna unit further includes a magnetic security transmission (MST) antenna, and the first shielding sheet of the magnetic field shielding unit corresponds to the magnetic security transmission antenna.

16. A portable device comprising a multifunctional integrated module of claim 13 as a receiving module.

* * * * *